US009741716B1

(12) United States Patent
Cheng et al.

(10) Patent No.: US 9,741,716 B1
(45) Date of Patent: Aug. 22, 2017

(54) FORMING VERTICAL AND HORIZONTAL FIELD EFFECT TRANSISTORS ON THE SAME SUBSTRATE

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/274,087

(22) Filed: Sep. 23, 2016

(51) Int. Cl.
H01L 21/8238 (2006.01)
H01L 27/088 (2006.01)
H01L 21/8234 (2006.01)
H01L 29/78 (2006.01)
H01L 29/423 (2006.01)

(52) U.S. Cl.
CPC .. *H01L 27/0886* (2013.01); *H01L 21/823431* (2013.01); *H01L 21/823456* (2013.01); *H01L 21/823487* (2013.01); *H01L 29/42376* (2013.01); *H01L 29/7827* (2013.01); *H01L 29/7851* (2013.01)

(58) Field of Classification Search
CPC ......... H01L 21/8238; H01L 21/823807; H01L 21/823814; H01L 21/823821; H01L 21/823828; H01L 21/82385; H01L 21/823857; H01L 21/823864; H01L 21/823871; H01L 21/823885; H01L 438/206; H01L 27/0924
USPC .......................................... 438/199; 257/401
See application file for complete search history.

(56) References Cited

U.S. PATENT DOCUMENTS

| | | | |
|---|---|---|---|
| 6,660,590 B2 | 12/2003 | Yoo | |
| 6,846,709 B1 | 1/2005 | Lojek | |
| 7,033,877 B2 | 4/2006 | Chaudhry et al. | |
| 7,535,016 B2 | 5/2009 | Furukawa et al. | |
| 8,314,459 B2 | 11/2012 | Kitamura | |
| 9,087,922 B2 | 7/2015 | Sun et al. | |
| 9,245,885 B1 | 1/2016 | Xie et al. | |

(Continued)

FOREIGN PATENT DOCUMENTS

| | | |
|---|---|---|
| CN | 102544049 B | 4/2014 |
| JP | 2231730 A | 9/1990 |

*Primary Examiner* — Sonya D McCall Shepard
(74) *Attorney, Agent, or Firm* — Cantor Colburn LLP; David Quinn

(57) ABSTRACT

A method of forming a vertical FET device and a horizontal FINFET device on a common semiconductor substrate includes forming, on the semiconductor substrate, vertical device fins for the vertical FET device and the horizontal FINFET device with a sacrificial layer and a hard mask (HM) layer. The method also includes forming a vertical FET device doped source and drain (S/D) on the substrate, forming a shallow trench isolation (STI) and a bottom spacer, removing the HM layer and the sacrificial layer for horizontal FINFET device, and forming a sacrificial gate. The method further includes forming an oxide inter dielectric (ILD) layer, and opening the sacrificial gate, forming high-k vertical FET device gate and a high-k horizontal FINFET device gate, and forming contacts.

17 Claims, 27 Drawing Sheets

(56) References Cited

U.S. PATENT DOCUMENTS

2011/0068387 A1 3/2011 Kitamura
2012/0319201 A1 12/2012 Sun et al.

FORMING VERTICAL AND HORIZONTAL FIELD EFFECT TRANSISTORS ON THE SAME SUBSTRATE

BACKGROUND

The present invention relates in general to semiconductor devices, and more specifically, to a semiconductor device having vertical-type and horizontal-type transistors integrated into the same device and methods of fabricating the same.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint. Although some FET performance characteristics are improved in vertical FET designs, there are challenges in providing vertical FET designs that do not compromise necessary FET device performance characteristics.

SUMMARY

According to one or more embodiments, a method of forming a vertical FET device and a horizontal FINFET device on a common semiconductor substrate is described. The method includes forming, on the semiconductor substrate, vertical device fins for the vertical FET device and the horizontal FINFET device with a sacrificial layer and a hard mask (HM) layer. The method also includes forming a vertical FET device doped source and drain (S/D) on the substrate, forming a shallow trench isolation (STI) and a bottom spacer, removing the HM layer and the sacrificial layer for horizontal FINFET device, and forming a sacrificial gate. The method further includes forming an oxide inter dielectric (ILD) layer, and opening the sacrificial gate, forming high-k vertical FET device gate and a high-k horizontal FINFET device gate, and forming contacts.

According to one or more embodiments of the present invention, a semiconductor includes a vertical FET device and a horizontal FINFET device. The vertical FET device and the horizontal FINFET device are on a common semiconductor substrate. The vertical FET device has a bottom source/drain (S/D) thickness similar to a thickness of a shallow trench isolation (STI) of the horizontal FINFET device, where the horizontal FINFET device has a silicone nitride layer above the STI of the horizontal FINFET device, and where the vertical FET device includes L-shaped gate.

According to yet another non-limiting embodiment, a semiconductor is described. The semiconductor includes a vertical FET device and a horizontal FINFET device on a common semiconductor substrate. The semiconductor further includes vertical device fins for the vertical FET device, horizontal device fins for the horizontal FINFET device, a doped bottom source/drain (S/D) on the semiconductor substrate. Also included on the semiconductor are a shallow trench isolation (STI) and a bottom spacer, an oxide inter dielectric (ILD) layer, contacts for the vertical FET device and the horizontal FINFET device, an L-shaped high-k vertical FET device gate, and a high-k horizontal FINFET device gate.

Additional features are realized through the techniques of embodiments of the present invention. Other embodiments are described in detail herein and are considered a part of the claimed invention. For a better understanding of embodiments, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of embodiments of the invention are apparent from the following detailed description taken in conjunction with non-limiting embodiments illustrated in the accompanying drawings. FIGS. 1-27 are a series of views illustrating a FET device with vertical-type and horizontal-type devices integrated therein, and a method of forming a FET device with vertical-type and horizontal-type devices integrated into the same device according to exemplary embodiments of the present teachings, in which:

FIG. 1 is a series of cross-sectional views of a singular starting semiconductor structure having a horizontal devices and vertical devices integrated on the same semiconductor substrate according to one or more embodiments;

FIG. 2 illustrates semiconductor structure 100 after epitaxial growth of a silicone germanium (SiGe) layer on the starting semiconductor structure of FIG. 1 according to one or more embodiments;

FIG. 3 illustrates the semiconductor structure of FIG. 2 after patterning silicone nitride (SiN) hardmasks on an upper surface of the semiconductor substrate according to one or more embodiments;

FIG. 4 illustrates the semiconductor structure of FIG. 3 before performing an etching process to transfer patterned trenches into the semiconductor substrate according, to one or more embodiments;

FIG. 5 illustrates the semiconductor structure of FIG. 4 after performing the etching process, and after deposition of oxide material according to one or more embodiments;

FIG. 6 illustrates the semiconductor structure of FIG. 5 with an oxide fill, chemical mechanical planarization, and a recess of the oxide according to one or more embodiments;

FIG. 7 illustrates the semiconductor structure of FIG. 6 after spacer formation according to one or more embodiments;

FIG. 8 illustrates the semiconductor structure shown in FIG. 7 after blocking the horizontal device and removing oxide for the vertical device according to one or more embodiments;

FIG. 9 illustrates the semiconductor structure of FIG. 8 following an epitaxial growth of a doped dielectric layer for the vertical device according to one or more embodiments;

FIG. 10 illustrates the semiconductor structure of FIG. 9 following removal of a fin spacer and epitaxial growth of a bottom spacer for the vertical devices according to one or more embodiments;

FIG. 11 illustrates the semiconductor structure of FIG. 10 after blocking the vertical device and removing silicone germanium and silicone nitride layers for the horizontal devices according to one or more embodiments;

FIG. 12 illustrates the semiconductor structure of FIG. 11 following a selective deposition of an oxide layer on the vertical and horizontal devices according to one or more embodiments;

FIG. 13 illustrates the semiconductor structure of FIG. 12 after formation of sacrificial gate stacks according to one or more embodiments;

FIG. 14 illustrates the semiconductor structure of FIG. 13 after chemical mechanical planarization according to one or more embodiments;

FIG. 15 illustrates the semiconductor structure of FIG. 14 after a-Si recess according to one or more embodiments;

FIG. 16 illustrates the semiconductor structure of FIG. 15 after silicon nitride filling and chemical mechanical planarization (CMP) and gate patterning according to one or more embodiments;

FIG. 17 illustrates the semiconductor structure of FIG. 16 after formation of silicone nitride spacers on the vertical and horizontal devices according to one or more embodiments;

FIG. 18 illustrates the semiconductor structure of FIG. 17 after recessing the silicone germanium on the vertical devices according to one or more embodiments;

FIG. 19 illustrates the semiconductor structure of FIG. 18 after removal of the silicone oxide from exposed surfaces of the vertical and horizontal devices according to one or more embodiments;

FIG. 20 illustrates the semiconductor structure of FIG. 19 after epitaxial formation of thin spacers on the vertical and horizontal devices and formation of the vertical top drain and source and drain for the horizontal devices according to one or more embodiments;

FIG. 21 illustrates the semiconductor structure of FIG. 20 after epitaxy of an oxide inter-level dielectric (ILD) on the vertical and horizontal devices, and chemical mechanical planarization according to one or more embodiments;

FIG. 22 illustrates the semiconductor structure of FIG. 21 opening the nitride and selectively removing the sacrificial gates according to one or more embodiments;

FIG. 23 illustrates the semiconductor structure of FIG. 22 after formation of high-k metal gates according to one or more embodiments;

FIG. 24 illustrates the semiconductor structure of FIG. 23 after formation of the high-k metal gate stacks, and deposition of a top layer of silicone nitride, according to one or more embodiments;

FIG. 25 illustrates the semiconductor structure of FIG. 24 after creating channels for gate and drain contacts according to one or more embodiments;

FIG. 26 illustrates the semiconductor structure of FIG. 25 after formation of gate and drain contacts in the channels with the same replacement gate material and the same gate height on the horizontal and vertical devices according to one or more embodiments; and FIG. 27 is a method for forming a combined vertical and horizontal transistor according to one or more embodiments.

DETAILED DESCRIPTION

Figure 1:
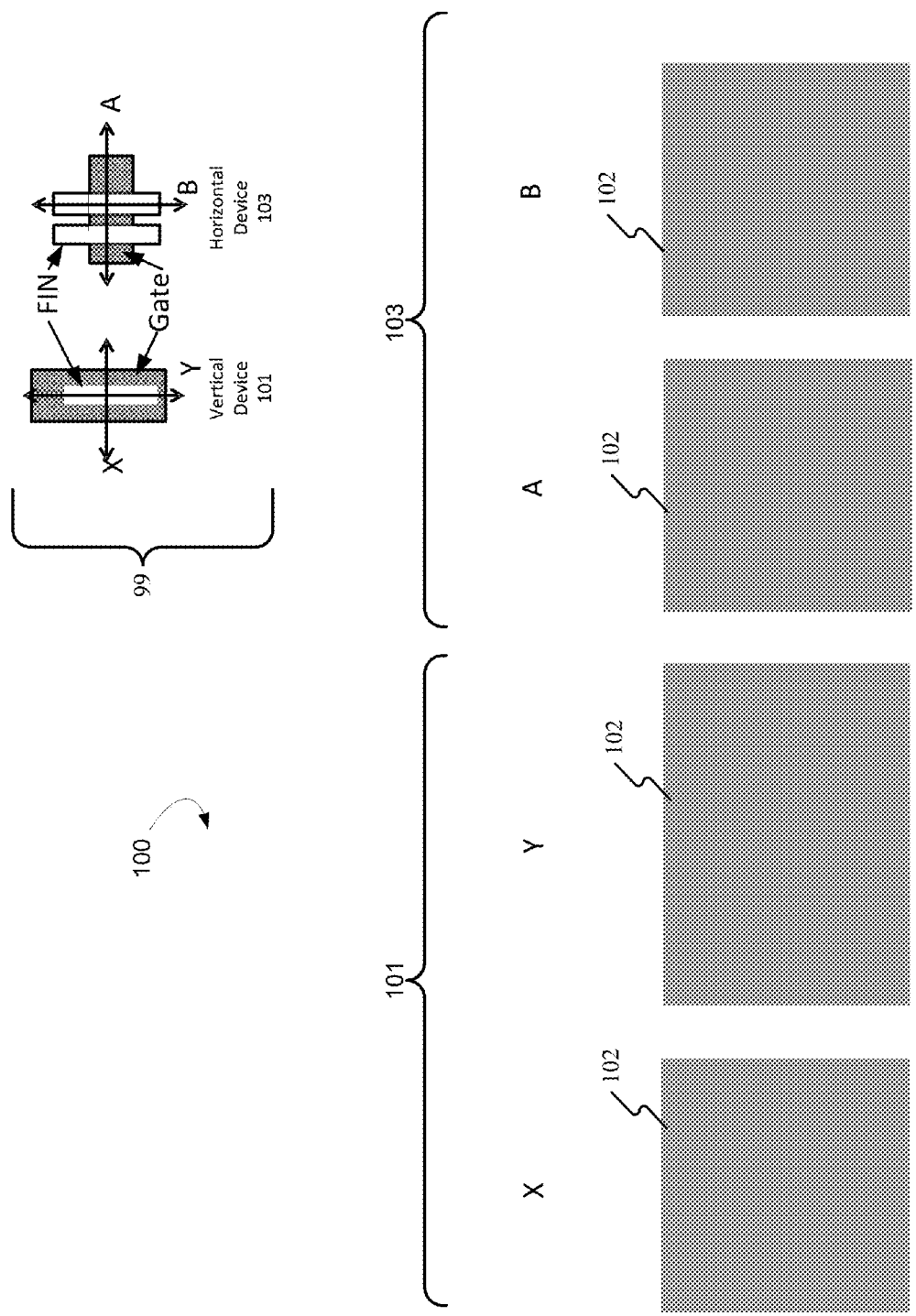

Various embodiments of the present invention are described herein with reference to the related drawings. Alternative embodiments are devised without departing from the scope of this disclosure. It is noted that various connections and positional relationships (e.g., over, below, adjacent, etc.) are set forth between elements in the following description and in the drawings. These connections and/or positional relationships, unless specified otherwise, are direct or indirect, and the embodiments of the present invention are not intended to be limiting in this respect. Accordingly, a coupling of entities can refer to either a direct or an indirect coupling, and a positional relationship between entities is a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" is understood to include any integer number greater than or equal to one, i.e. one, two, three, four, etc. The terms "a plurality" is understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein is incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that is utilized in implementing one or more embodiments will now be provided. Although specific fabrication operations used in implementing one or more embodiments is individually known, the disclosed combination of operations and/or resulting structures are unique. Thus, the unique combination of the operations described in connection with the fabrication of vertical FETS and horizontal FINFETS on the same chip, where the replacement gate material and gate heights are uniform between the vertical and horizontal devices utilize a variety of individually known physical and chemical processes performed on a semiconductor (e.g., silicon) substrate. In general, the various processes used to form a micro-chip that will be packaged into an IC fall into three categories, namely, film deposition, patterning, etching, and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to an overview, as previously noted herein, vertical-type transistors such as vertical FETs have recently been developed to achieve a reduced FET device footprint.

A vertical FET has a channel perpendicular to the substrate surface as opposed to a conventional FET, which has a channel extending substantially parallel to the substrate surface. By forming the channel substantially perpendicular to the substrate surface, vertical FETs improve the device density beyond FET devices that have their channels positioned substantially parallel to the substrate surface. In known techniques for forming vertical FETS, the gate regions are formed having uniform length.

Embodiments described herein provide fabrication techniques for forming vertical FETS and horizontal FINFETS on the same chip, having uniform replacement gate material and gate heights. In particular, some embodiments include forming FINs with sacrificial layer 104 for both vertical FET device 101 and horizontal FET device 103, performing an additional FIN reveal for VFET and forming bottom source and drain (S/D), removing sacrificial layer 104 for horizontal FINFET device 103, forming a dummy gate and recessing dummy gate, such that the dummy gate height is above the top surface of horizontal FINFET device 103, but still lower than the top surface of the sacrificial material of vertical FET device 101, gate patterning and spacer formation, removing sacrificial material for vertical FET device 101, and forming S/D region for horizontal FET and top S/D region for VFET together, and dummy gate removal and forming replacement gate which having uniform gate length for vertical FET device 101.

Turning now to a more detailed description of one or more embodiments, with reference to FIG. 1, a starting semiconductor structure 100 is illustrated according to one or more embodiments. FIG. 1 shows four section views X, Y, A, and B of the same semiconductor structure 100. FIG. 1 also depicts a device plan view 99, which shows a vertical FET device 101 and a horizontal FINFET device 103. As shown in device plan view 99, semiconductor structure 100 includes both vertical FET devices 101 and horizontal FINFET devices 103, which are configured in the same semiconductor structure 100. The section arrows shown in device plan view 99 define each corresponding view of semiconductor structure 100 with respect to devices 101 and 103. For example, section X (also referred to as "view X") depicts a section cut through a fin of vertical FET device 101. View X of vertical FET device 101 shows a section through semiconductor substrate 102 prior to formation of vertical device fins (shown in detail after fin formation in FIG. 3). Section Y (referred to also as "view Y") is depicted in device plan view 99 as a vertical arrow cutting along the length of a fin in vertical FET device 101 (the fin shown in greater detail after fin formation in FIG. 3).

Views A and B of FIG. 1 depict section A (referred to also as "view A") is a section through two fins (also shown in FIG. 3 after formation) in horizontal FINFET device 103.

The starting semiconductor structure 100 includes a semiconductor substrate 102. Semiconductor substrate 102 can include a bulk semiconductor substrate or a semiconductor-on-insulator (SOI) substrate as understood by one of ordinary skill in the art. In one non-limiting embodiment, the material of the semiconductor substrate is silicon (Si). Other semiconductor substrates are also conceived. The semiconductor substrate 102 may include other structures (not shown) such as isolation, doped wells that can be formed by techniques well known in the art.

Figure 2:
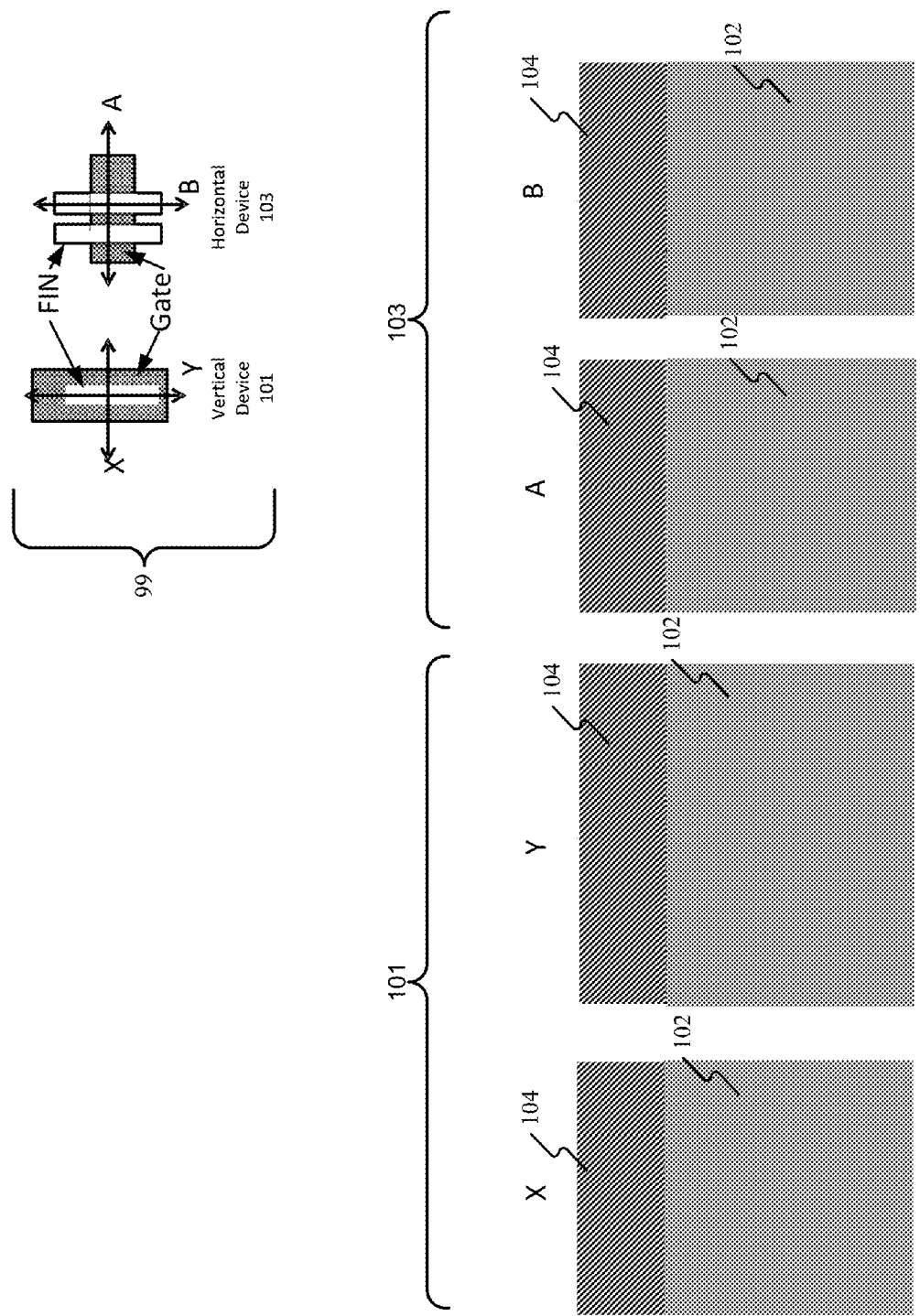

FIG. 2 illustrates semiconductor structure 100 after epitaxial growth of a sacrificial layer 104. According to some embodiments, sacrificial layer 104 is silicone germanium (SiGe) configured to control the gate length of the vertical FET device 101 and create a difference between the vertical FET device 101 and horizontal FINFET device 103.

Figure 3:
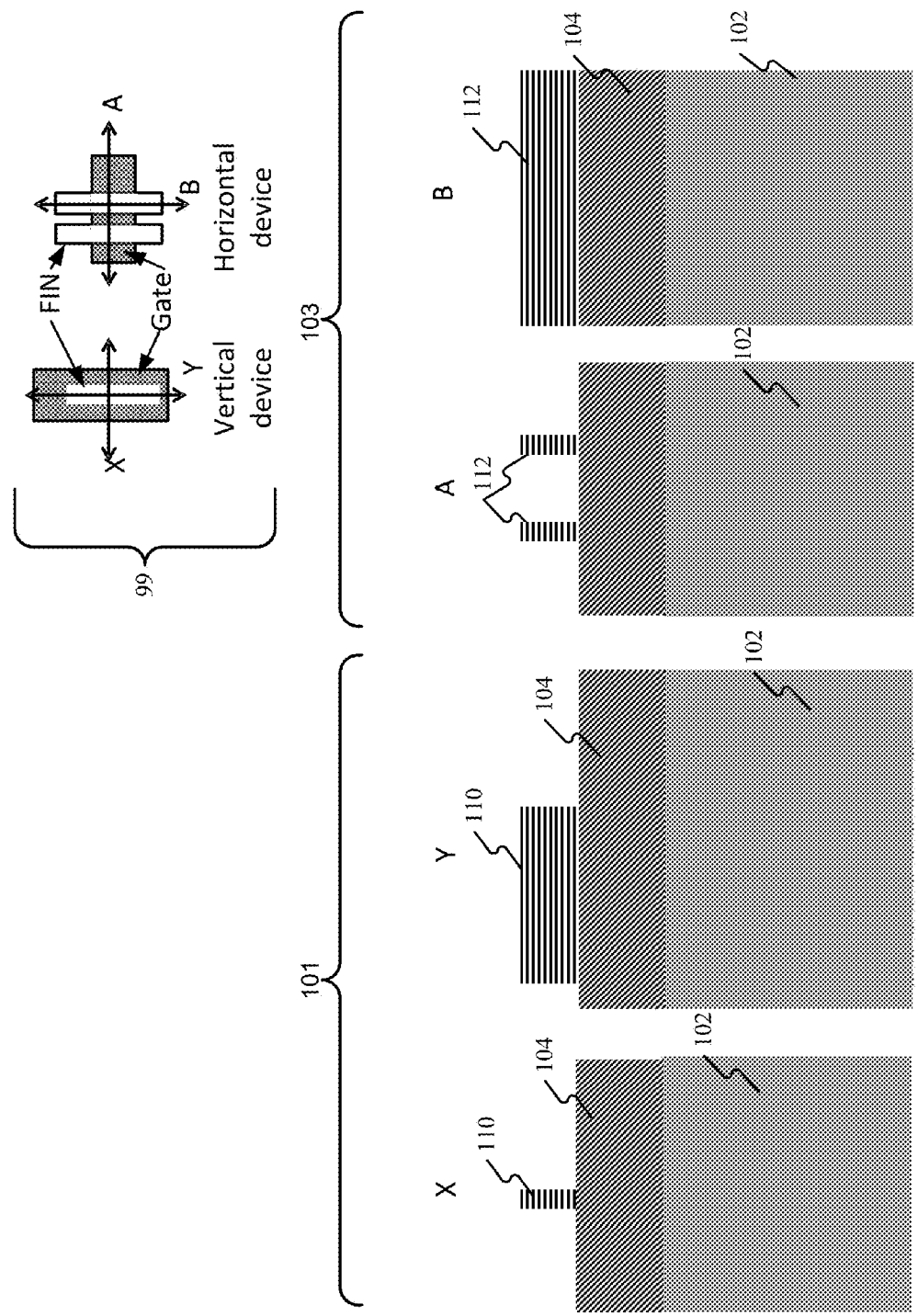

FIG. 3 illustrates semiconductor structure 100 after patterning hardmasks 110 and 112 on an upper surface of sacrificial layer 104, according to one or more embodiments. Referring now to FIG. 3, semiconductor structure 100 is illustrated after patterning and forming hardmasks 110 and 112 on an exposed surface of the SiGe sacrificial layer 104. Hardmasks 110 (for forming one or more fins on vertical FET device 101) and hardmasks 112 (for forming a plurality of fins for horizontal FINFET device 103) are formed by depositing a masking layer on the upper surface of the sacrificial layer 104. Hardmasks 110 and 112 can be formed by depositing HM material followed by lithography patterning and etching process. Hardmasks 110 and 112 can be any suitable material, such as, for example, a nitride or silicon nitride. Although a limited number of fins is depicted (illustrated after etching in FIG. 3), it should be appreciated that a plurality of fins can be etched in sacrificial layer 104 and semiconductor substrate 102, and some unneeded fins are removed by various etching or other fin removal processes. The masking layer(s) can include a photosensitive material deposited using known methods (such as a spin coating process, for example) followed by photolithography. The masking layer can be, for example, a nitride hardmask. Alternatively, the masking layer can include a hardmask layer such as amorphous carbon.

Figure 4:
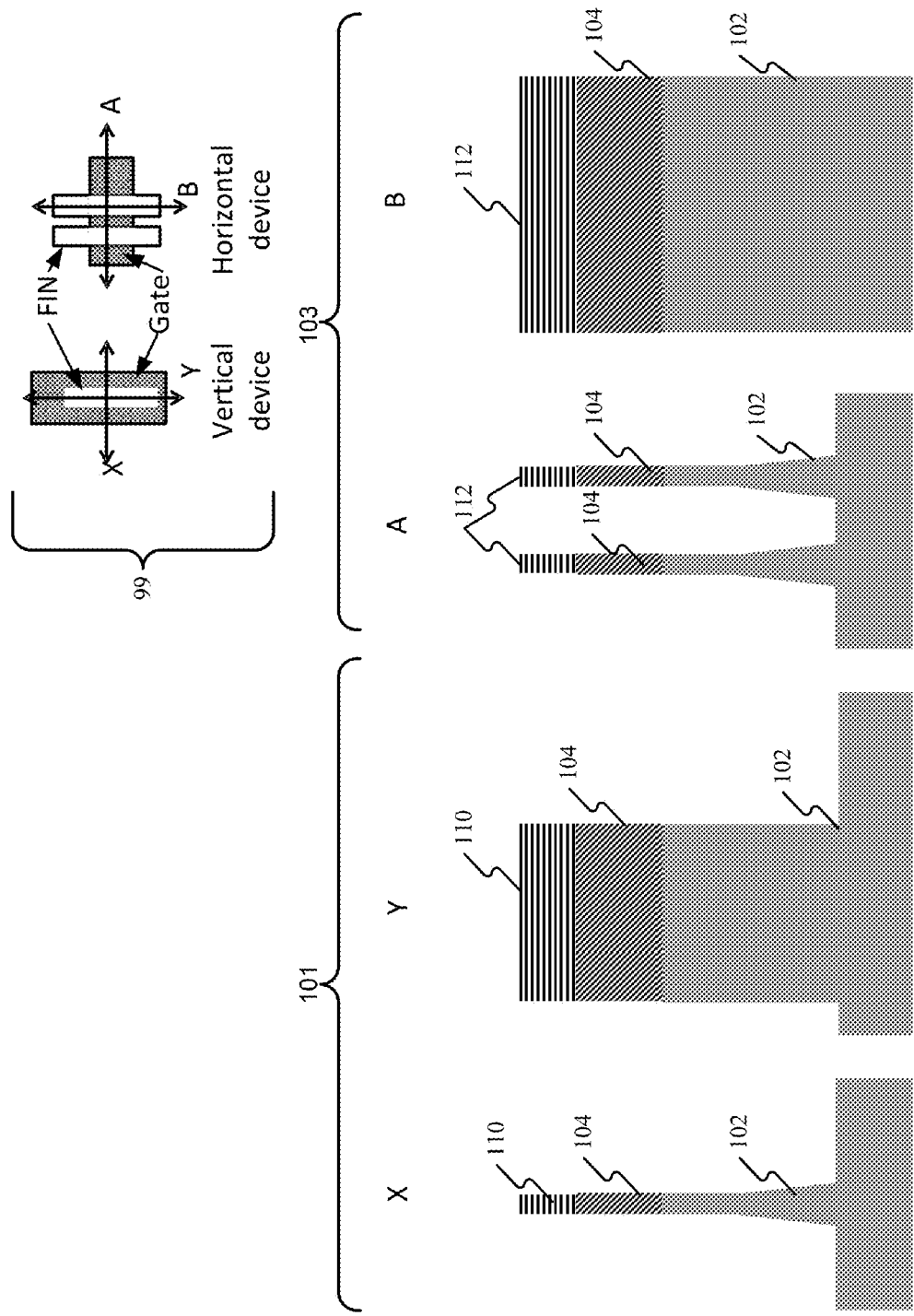

FIG. 4 illustrates semiconductor structure 100 after performing an etching process to transfer patterned trenches into semiconductor substrate 102 according, to one or more embodiments. Referring now to FIG. 4, an etch is applied to the semiconductor structure 100 to etch into the portions of sacrificial layer 104 and semiconductor substrate 102 that are not covered by the hardmasks 110 and 112, thereby forming a plurality of respective fins for devices 101 and 103. In one non-limiting embodiment, a single etching process selective to a substrate material is used to etch around the hardmasks 110 and 112 while stopping at a particular depth. Although only three fins are shown, it should be appreciated that any number of fins are contemplated.

Figure 5:
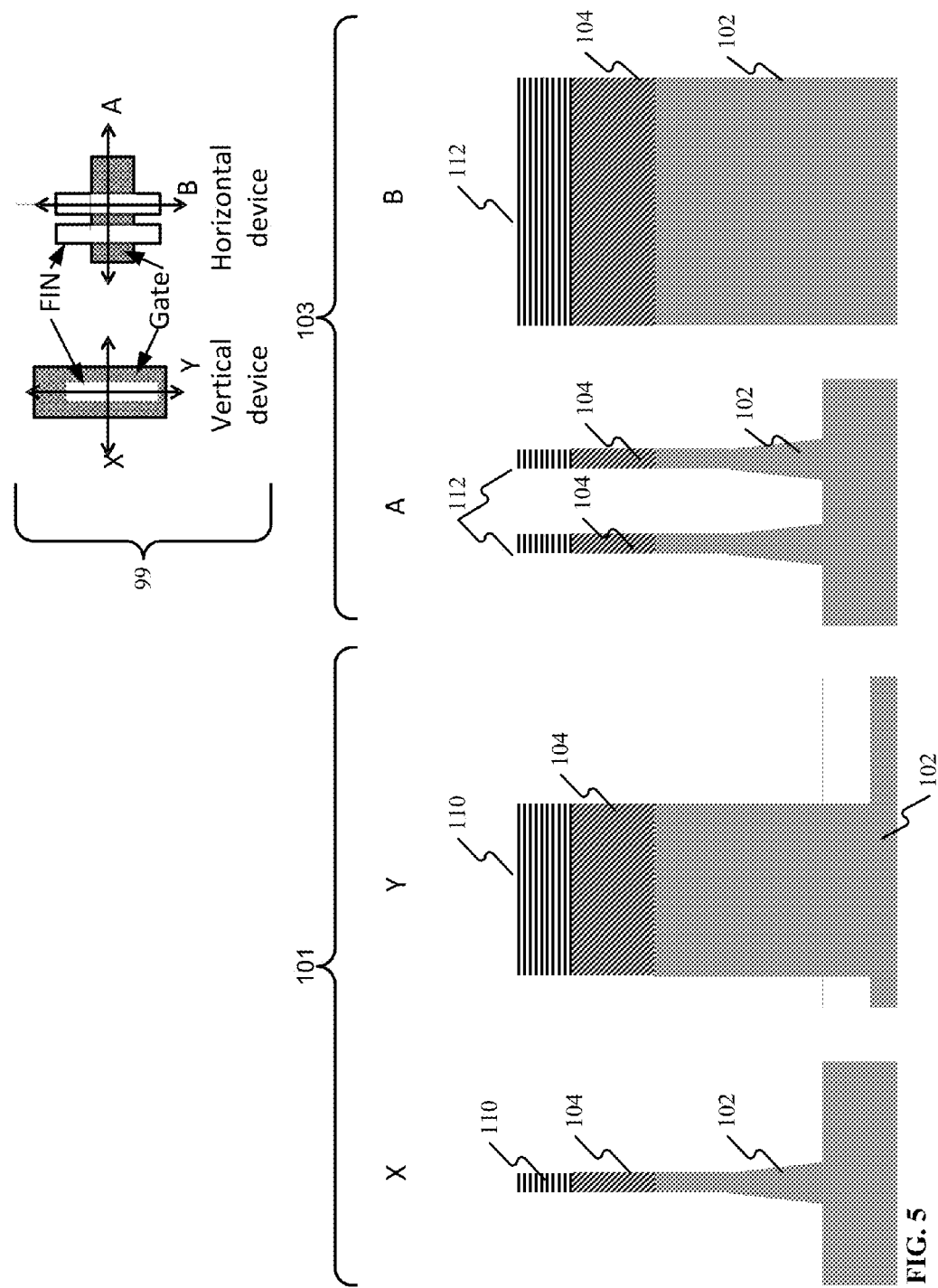

FIG. 5 illustrates semiconductor structure 100 after performing an etching process, and deposition of oxide material, according to one or more embodiments. In some aspects, as depicted in view Y, a lithography process is used to further etch down semiconductor substrate 102 to form STI region for vertical FET device 101, and oxide fill material 106 is deposited. A CMP process can be performed to make the base of the fins planar.

Figure 6:
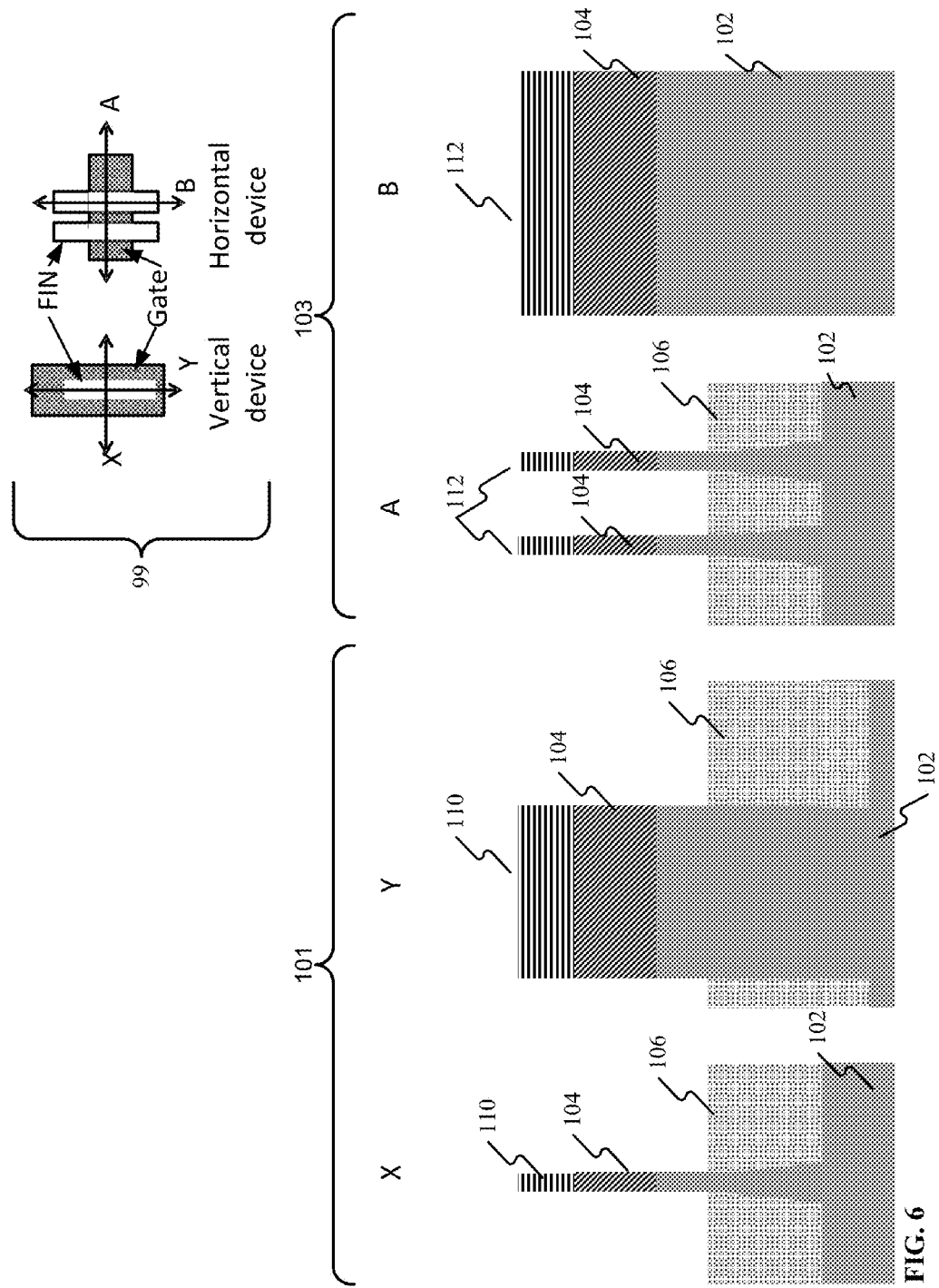

FIG. 6 illustrates semiconductor structure 100 after oxide fill step with oxide material 106, a chemical mechanical planarization (CMP) step, and a step that includes recess of oxide material 106, according to one or more embodiments. Referring now to FIG. 6, in some aspects, oxide material 106 is deposited on semiconductor substrate 102 to a predetermined level that defines a bottom extent of the spacers for devices 101 and 103. Oxide material 106 may fill to a top surface of hardmask layer 110. Oxide material 106 can be made of, for example, silicon oxide.

Next, a CMP is performed and oxide material 106 is recessed on vertical FET device 101 and horizontal FINFET device 103, where the recessed level is co-planar on both of devices 101 and 103.

Figure 7:
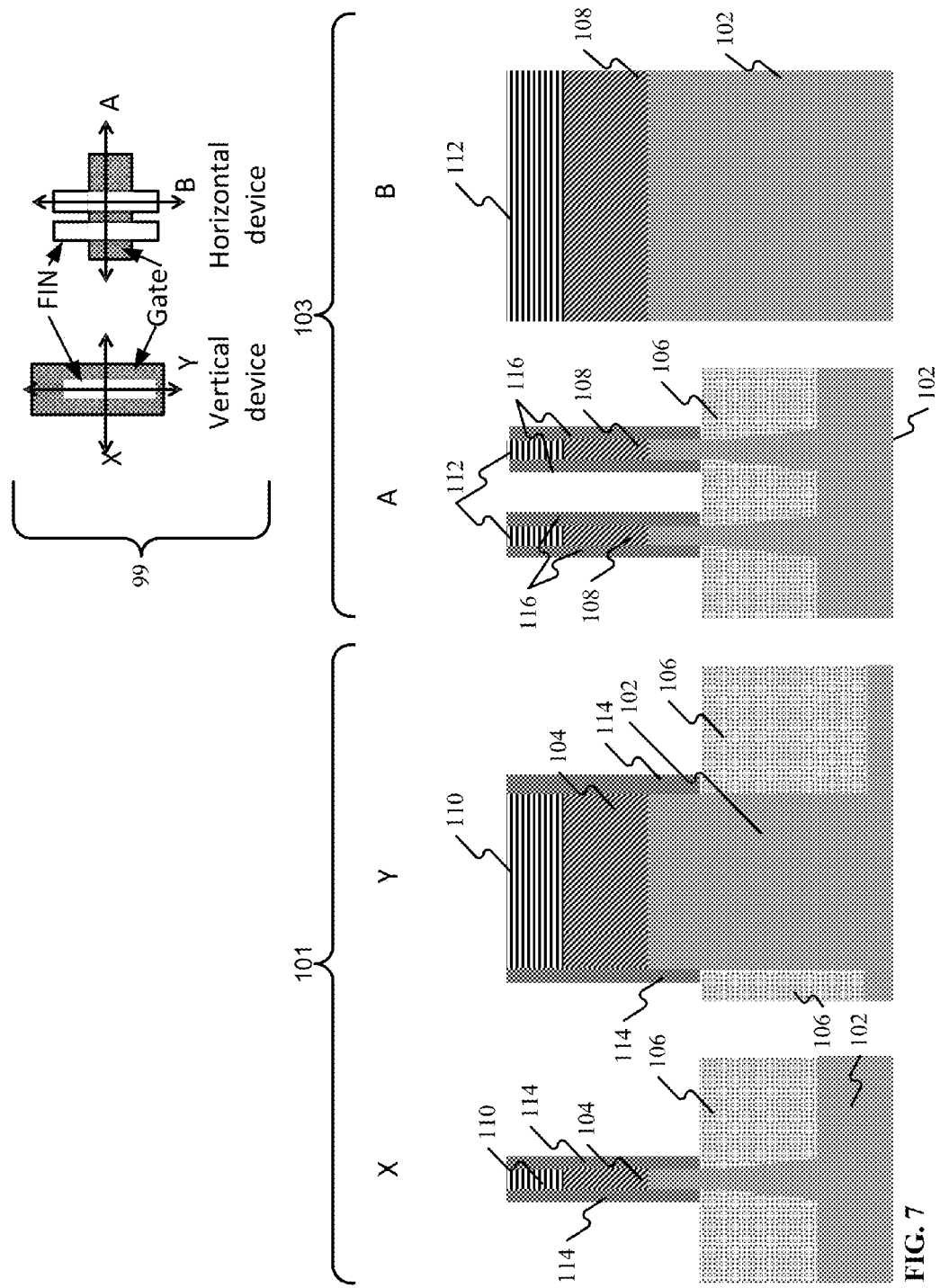
Figure 8:
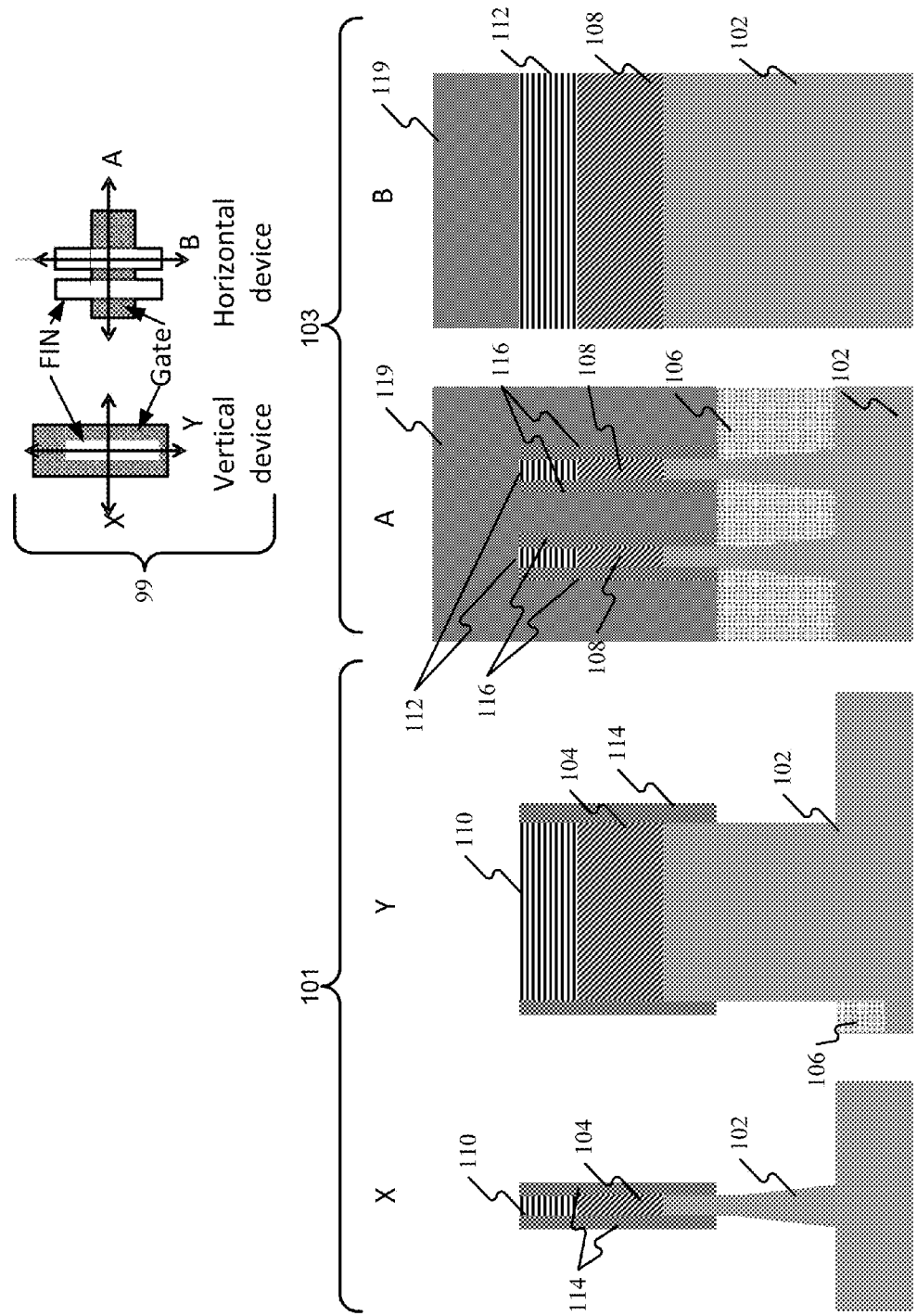

FIG. 7 illustrates semiconductor structure 100 after fin spacer formation, according to one or more embodiments. Referring now to FIG. 7, fin spacers 114 are formed on vertical FET device 101. Spacers 116 are formed on the fins of horizontal FINFET device 103. The dielectric fin spacer layers (which can be deposited simultaneously or with separate processes) include lower spacers 114 and 116. In some exemplary embodiments spacer material can be aluminum oxide ($Al_2O_3$), silicone nitride (SiN) or silicone carbon oxide (SiCO), or Ti oxide (TiOx). The fin spacers 114 and 116 are deposited by a chemical vapor deposition (CVD) process, such as low pressure chemical vapor deposition (LPCVD), GCIB, high density plasma chemical vapor deposition (HDP-CVD), plasma enhanced chemical vapor deposition (PECVD), or atomic layer deposition (ALD), etc., followed by anisotropic spacer RIE process FIG. 8 illustrates semiconductor structure 100 after blocking the horizontal devices with an organic planarization layer (OPL) photoresist mask 119 and further recessing oxide for the vertical devices, according to one or more embodiments. As shown in FIG. 8, OPL photoresist mask 119 is deposited over horizontal FINFET device 103. Thereafter, a separate etching process selective to vertical FET device 101 is performed to recess oxide material 106. The OPL photoresist mask 119 allows further etching of oxide material 106 in vertical FET device 101 and retention of the oxide material 106 in the horizontal FINFET device 103.

Figure 9:
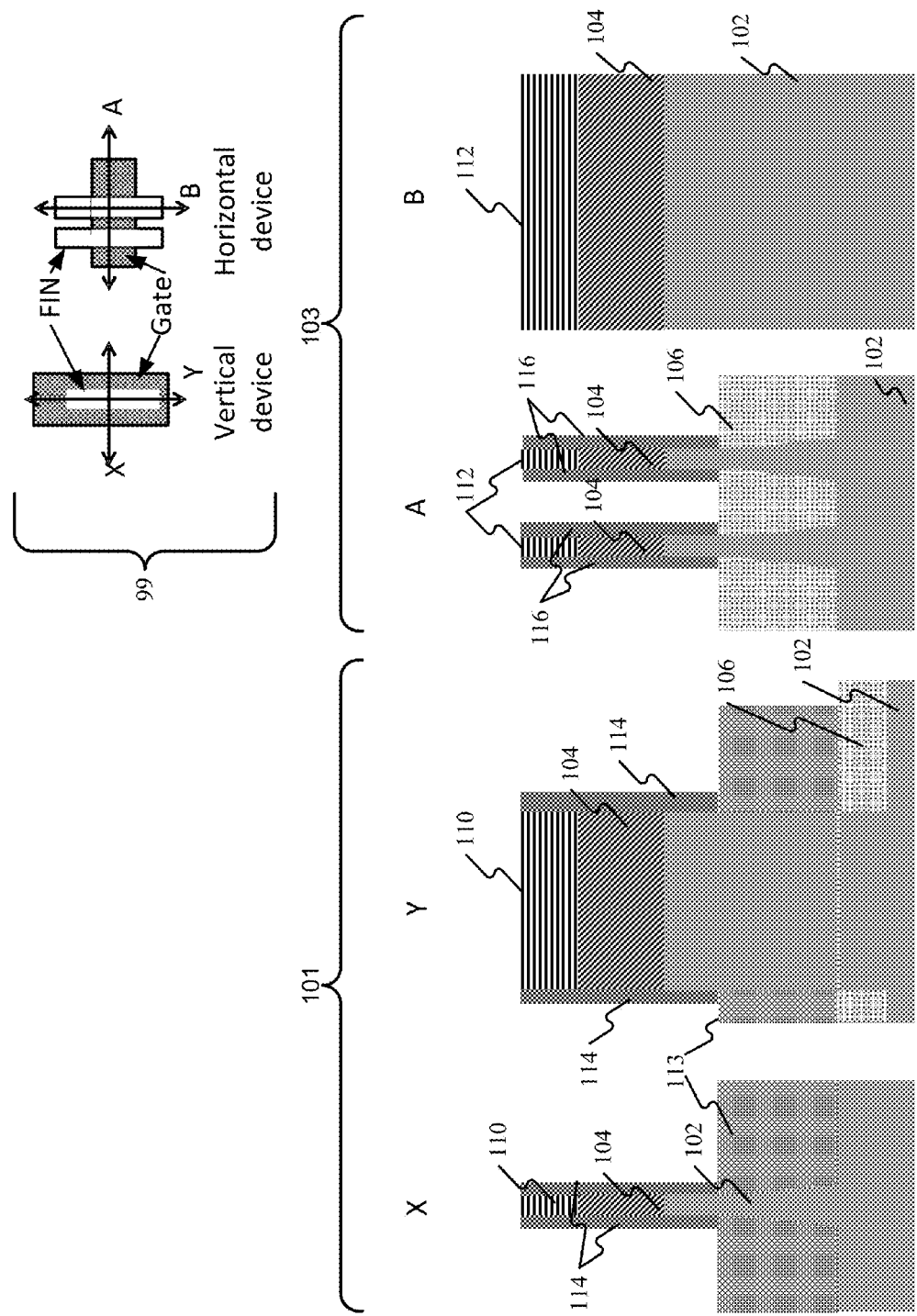

FIG. 9 illustrates semiconductor structure 100 following an epitaxial growth of a doped semiconductor layer 113 for vertical FET device 101 as bottom source/drain region for VFET, according to one or more embodiments. Referring now to FIG. 9, doped semiconductor layer 113 can include, for example, boron doped SiGe for a PFET, phosphorous doped Si for a NFET.

Various epitaxial growth processes can be used to grow the doped semiconductor layer 113. For example, layer 113 is epitaxially grown using chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 10:
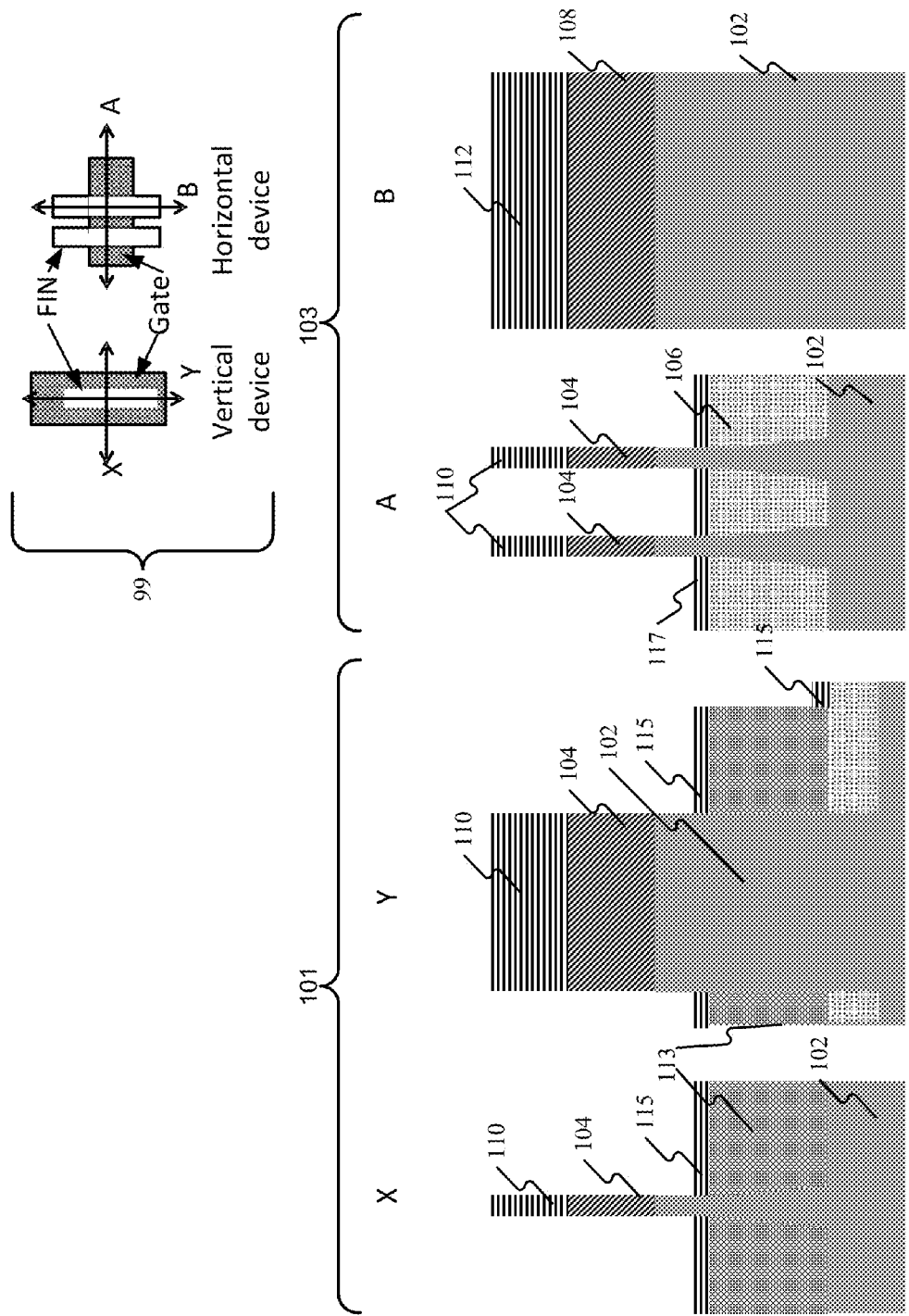
Figure 11:
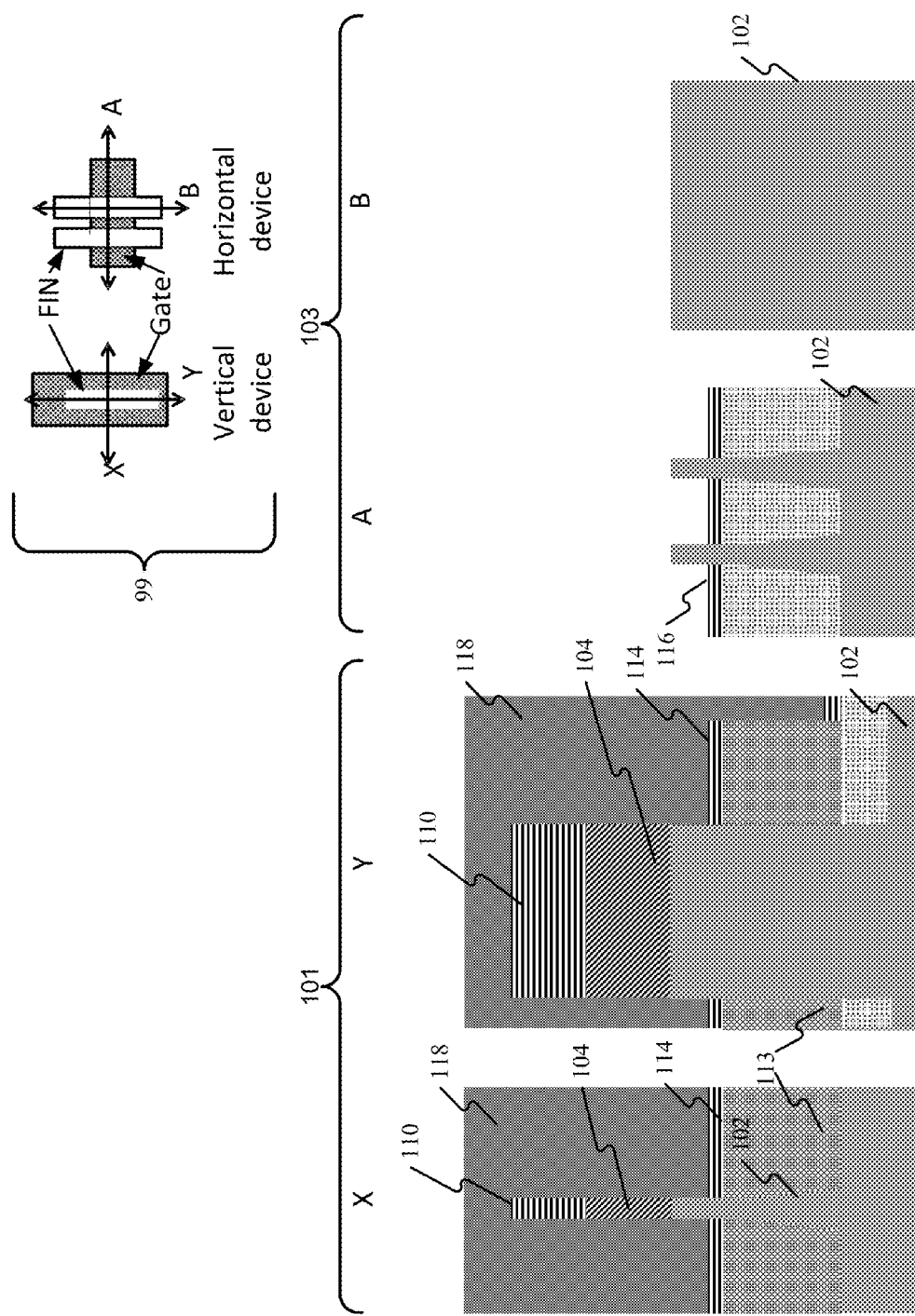

FIG. 10 illustrates semiconductor structure 100 following removal of fin spacers 114 and 116, and formation of a bottom spacer 115 for vertical FET device 101, according to one or more embodiments. Fin spacers 114 and 116 can be removed by a wet SC1 clean process if the spacer is TiOx. Bottom spacer 115 is formed on top of doped semiconductor layer 113 on vertical FET device 101, as depicted in sections X and Y of FIG. 10. Bottom spacers 115 and 117 (and spacers 130, 132, and 134, described hereafter) can be any suitable material, such as, for example, a low-k dielectric, a nitride, silicon nitride (SiN), silicon oxygen carbonitride (SiOCN), or silicoboron carbonitride (SiBCN), and may be directionally deposited by any directional deposition process such as, for example, gas cluster ion Beam (GCIB), or HDP deposition followed etch back FIG. 11 illustrates semiconductor structure 100 after blocking vertical FET device 101 and removing the silicone germanium (SiGe) sacrificial layer 104 and HM layer 110 (which may be, e.g., silicone nitride) on horizontal FINFET device 103, according to one or more embodiments. Referring now to FIG. 11, a masking material such as, for example, OPL photoresist mask 118, is deposited on bottom spacer 114 of vertical FET device 101, as shown in FIG. 11. This process step protects vertical FET device 101 while sacrificial fin portions are removed from horizontal FINFET device 103. Accordingly, sacrificial layer 104 and HM layer 110 are removed from horizontal FINFET device 103, leaving only silicone fins fabricated from semiconductor substrate 102. Sacrificial layer 104 and HM layer 110 can be removed from horizontal FINFET device 103 with a selective etching process. One benefit of leaving sacrificial layer 104 and HM layer 110 on horizontal FINFET device 103 to this point in the formation process is control of the standing silicone fin height during the previous formation steps. More particularly, the standing silicone fin height is maintained (and not variable) due to the cumulative loss of fin material by of any of the preceding processes. According to one embodiment, this process is to creates a height difference between horizontal and VEFT devices, such that during dummy gate formation, the gate can fully cover the horizontal devices, while for vertical FET device 101, the top of the FIN is still accessible later to form top S/D.

Figure 12:
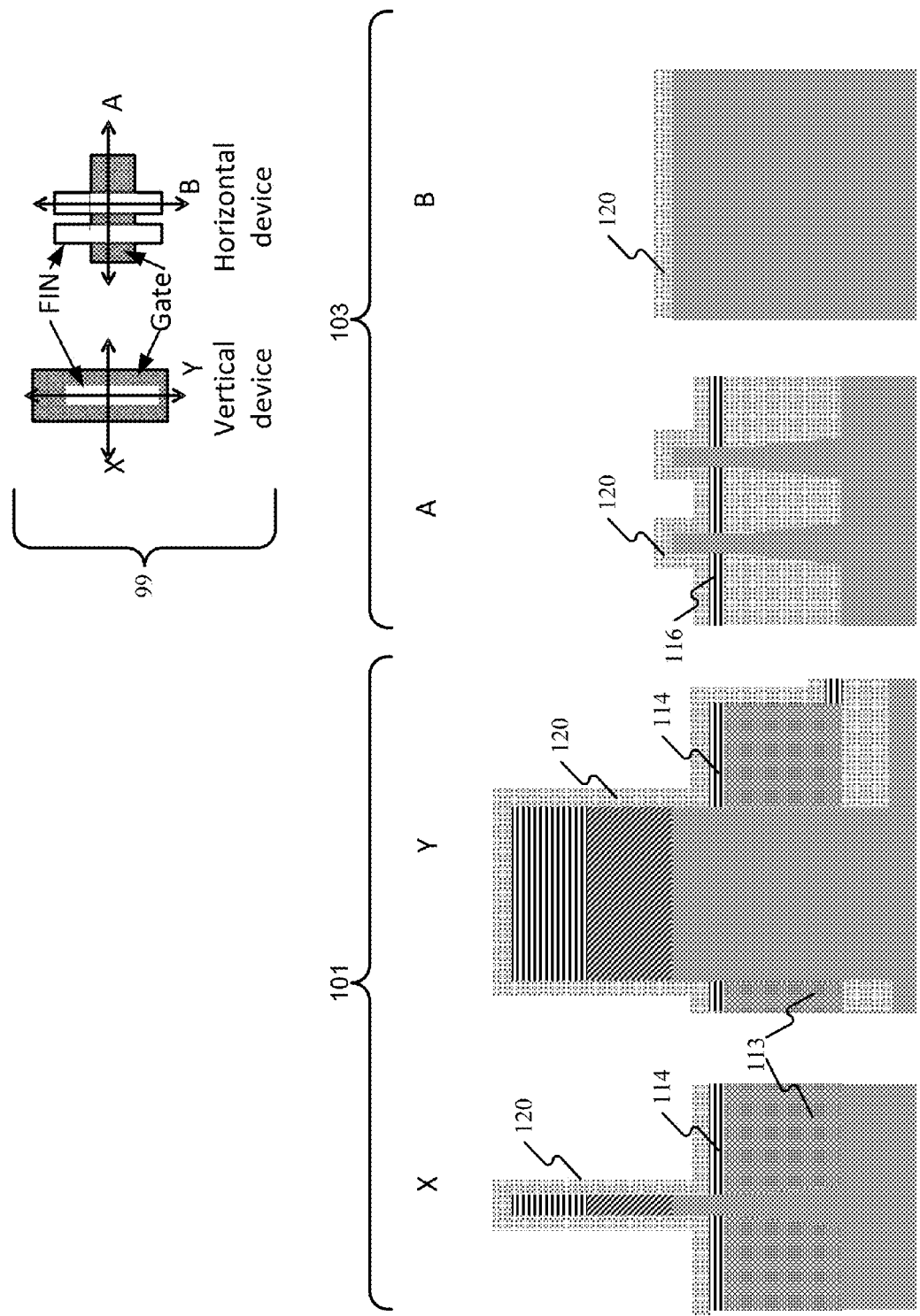

FIG. 12 illustrates semiconductor structure 100 following removal of OPL photoresist mask 118 and deposition of a silicone oxide sacrificial gate layer 120 on vertical FET device 101 and horizontal FINFET device 103, according to one or more embodiments. Referring now to FIG. 12, OPL photoresist mask 118 is selectively removed from vertical FET device 101 to reveal HM 110 and fin spacer 115 on vertical FET device 101. After removal of the OPL photoresist mask 118, a sacrificial gate layer 120 is deposited on both of vertical FET device 101 and horizontal FINFET device 103. Sacrificial gate layer 120 may be, for example $SiO2$.

Figure 13:
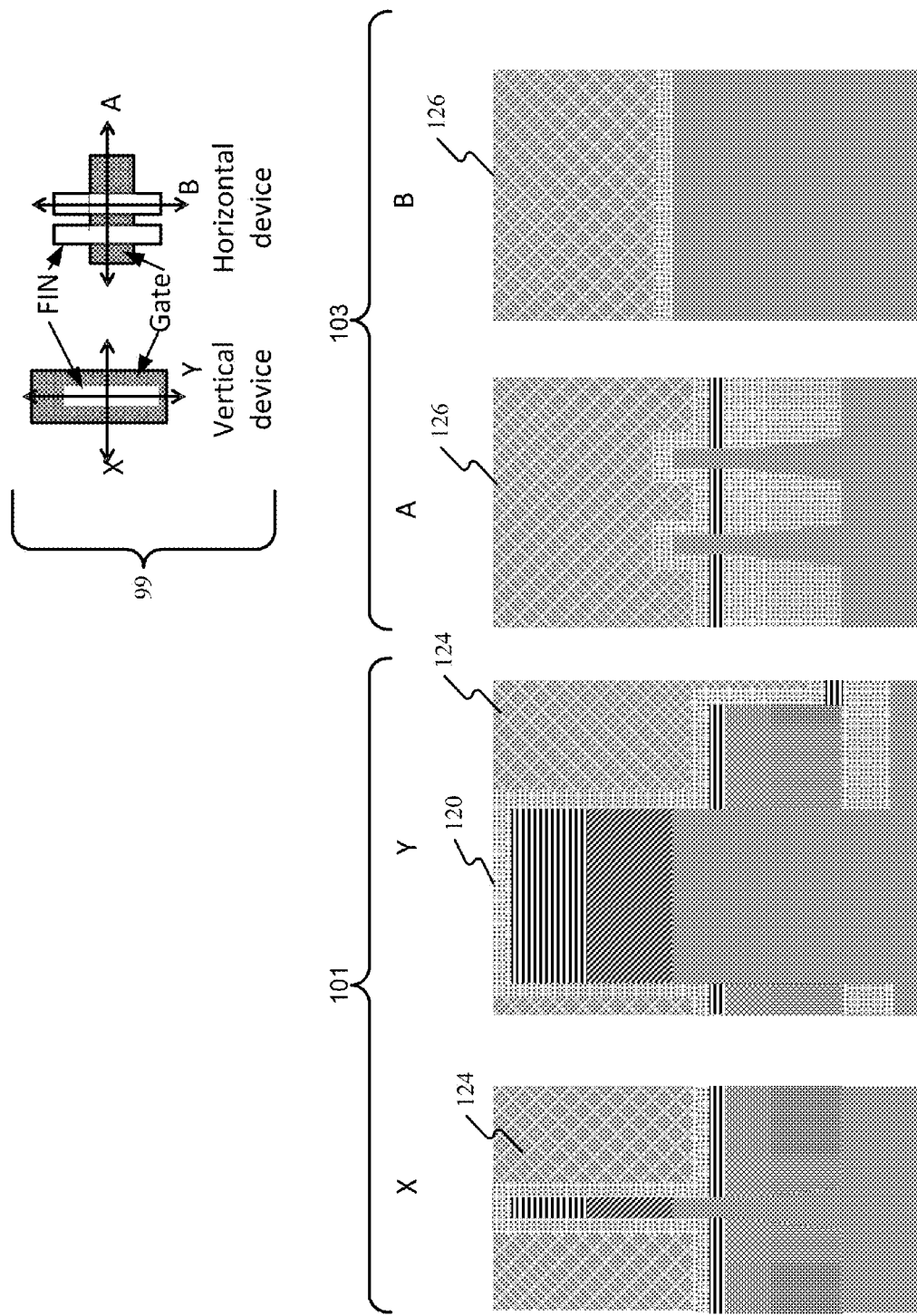

FIG. 13 illustrates semiconductor structure 100 after formation of sacrificial gate stacks 124 and 126 according to one or more embodiments. Referring now to FIG. 13, a sacrificial gate stack 124 for the vertical device sacrificial gate stack 126 for the horizontal device are deposited on sacrificial gate insulator layer 120. Sacrificial gate stack 124 for the vertical device sacrificial gate stack may be amorphous silicone (a-Si), or other suitable material. For example, sacrificial gate stack 124 can be made of polycrystalline or amorphous silicon, germanium, silicon germanium, Sacrificial gate stack 124 is then polished back to the height of sacrificial gate layer 120 on vertical FET device 101.

Figure 14:
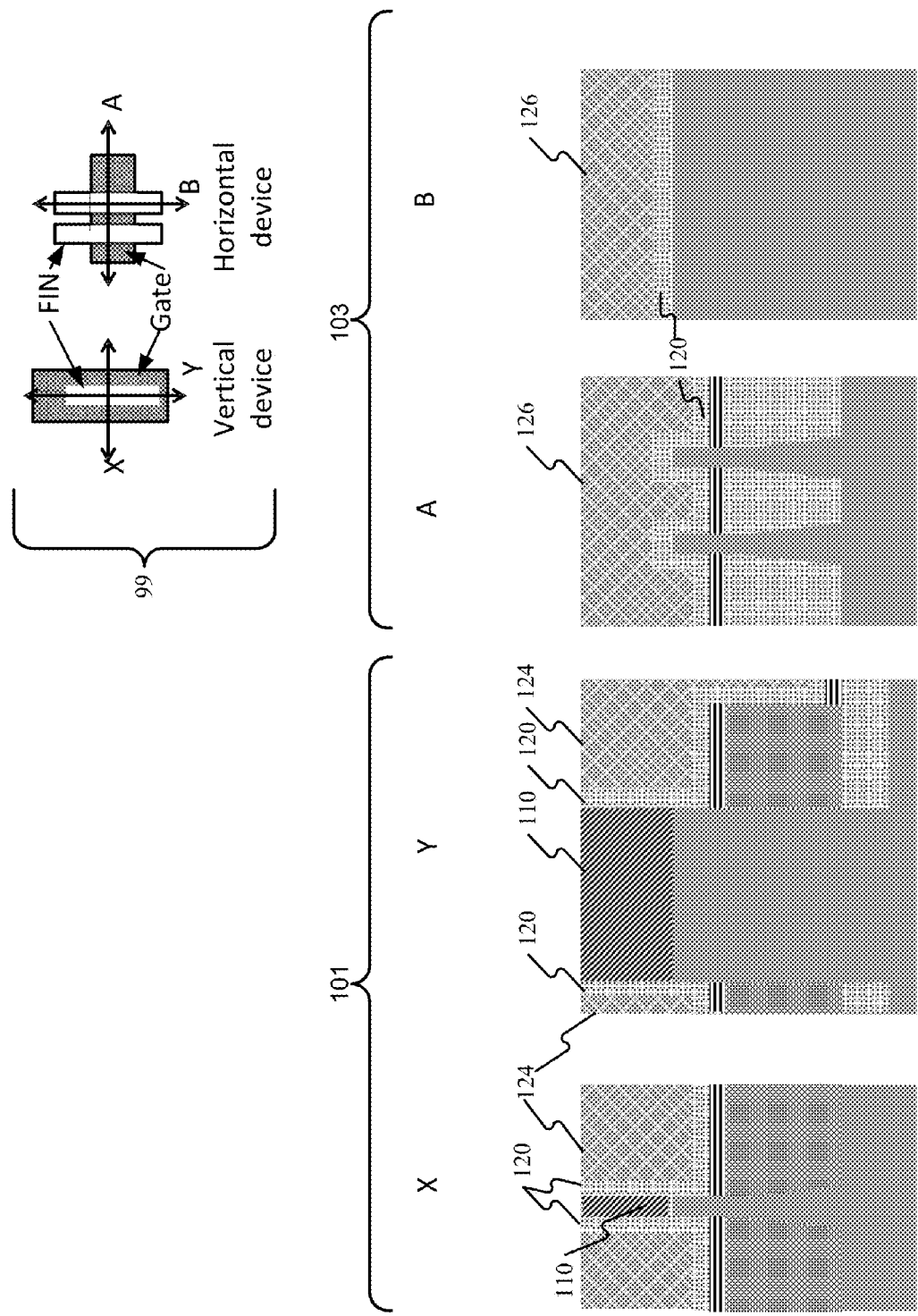

FIG. 14 illustrates semiconductor structure 100 after a chemical mechanical planarization step, according to one or more embodiments. Referring now to FIG. 14, after recessing sacrificial gate layer 120, a chemical mechanical planarization step is performed on semiconductor structure 100 to bring the top surfaces of the structure to a level below HM layer 110, while exposing sacrificial layer 104.

Figure 15:
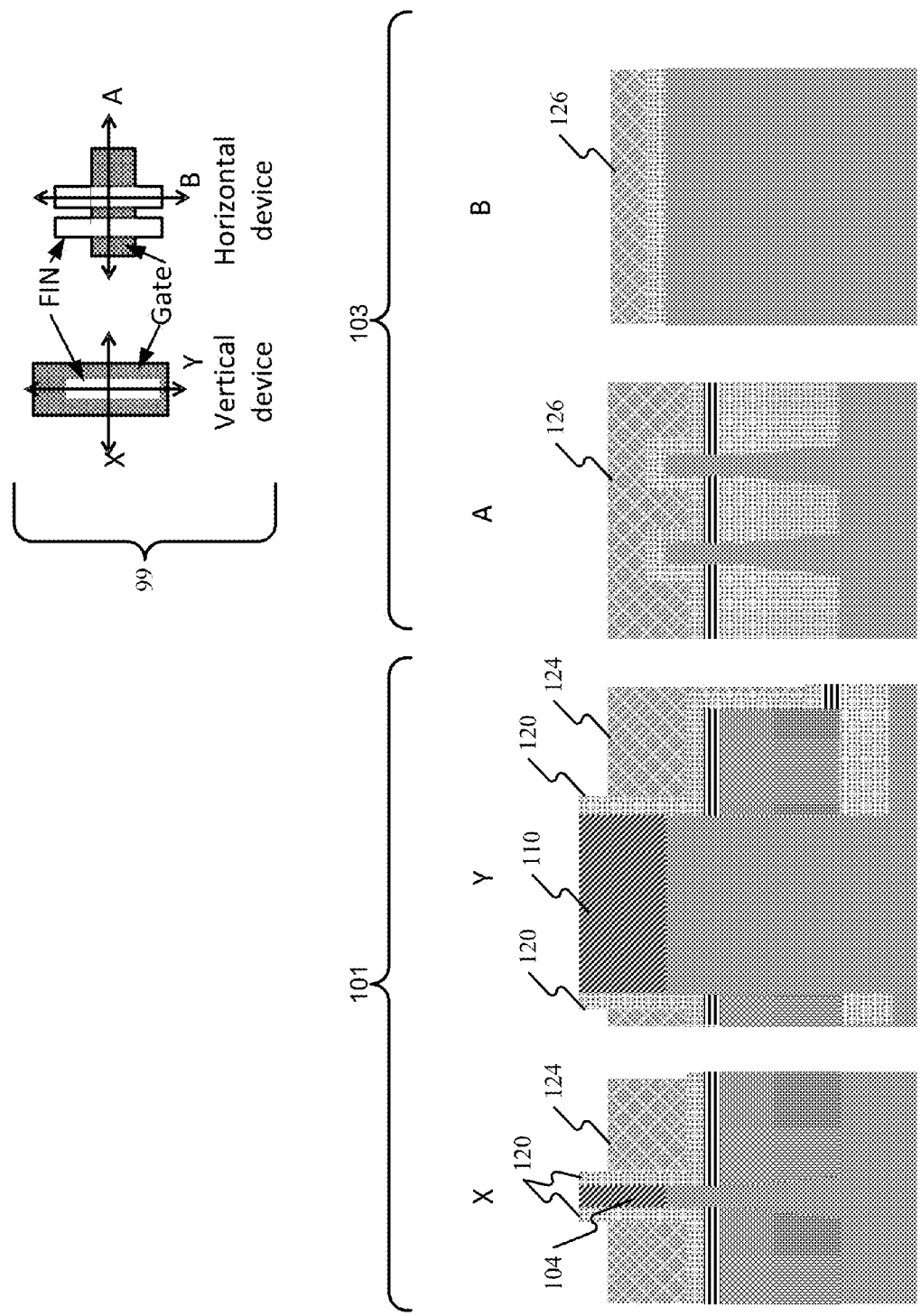

FIG. 15 illustrates semiconductor structure 100 after a selective recess of sacrificial gate stack 124 for vertical FET device 101, and sacrificial gate stack 126 for horizontal FINFET device 103, according to one or more embodiments.

Figure 16:
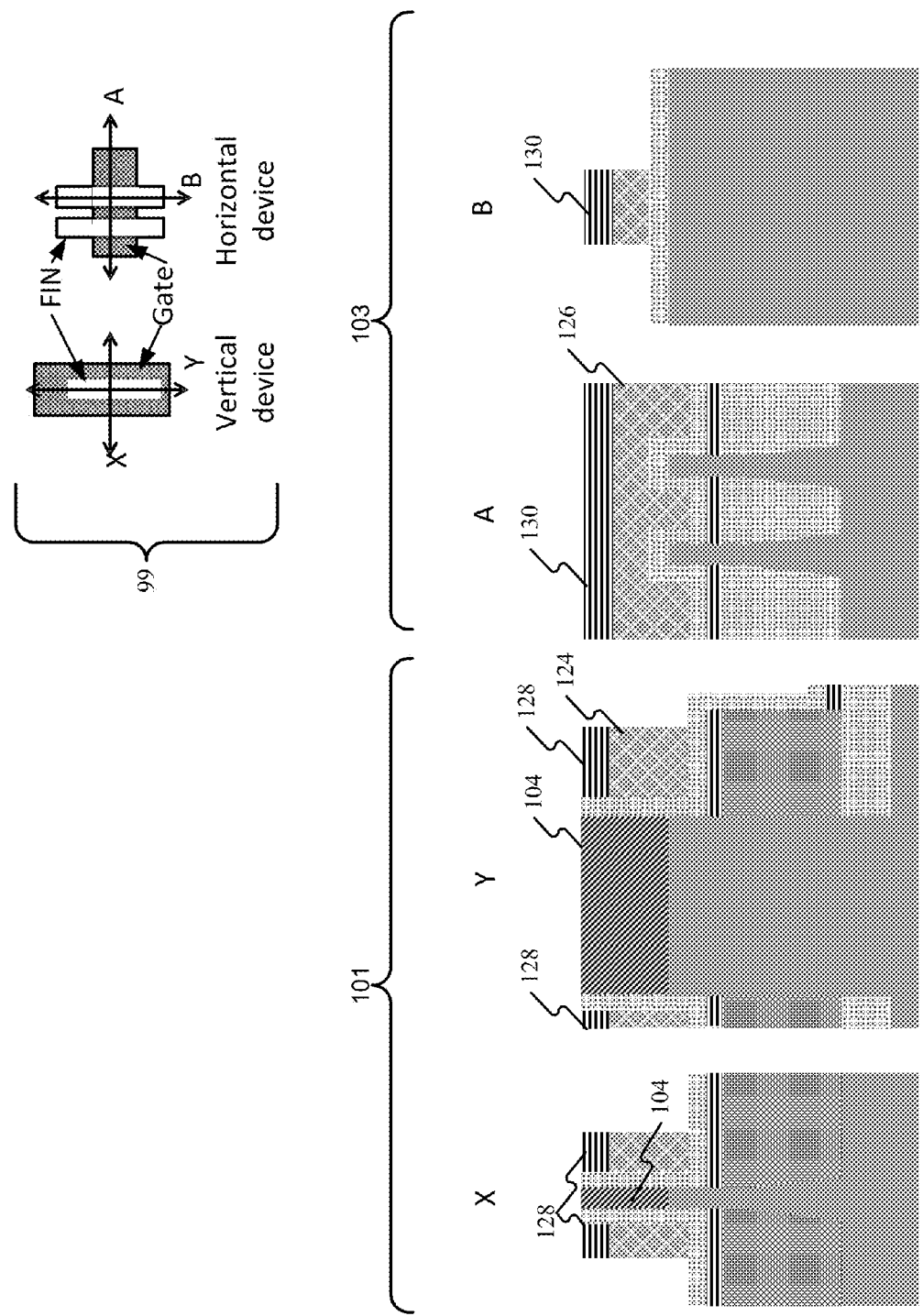

FIG. 16 illustrates semiconductor structure 100 after silicon nitride 128 and 130 filling and CMP, followed by gate patterning, according to one or more embodiments. A silicon nitride (SiN) spacer 128 and 130 is deposited in the recessed portions of semiconductor structure 100 to protect the uppermost portions of sacrificial gate stack 124 for vertical FET device 101 and sacrificial gate stack 126 for horizontal FINFET device 103, respectively. The silicon nitride 128 and 130 are polished back to reveal the SiGe sacrificial layer 104 on vertical FET device 101. Another photoresist (not shown) is used to pattern sacrificial gate stack 124 and sacrificial gate stack and etch away selective nitride portions.

Figure 17:
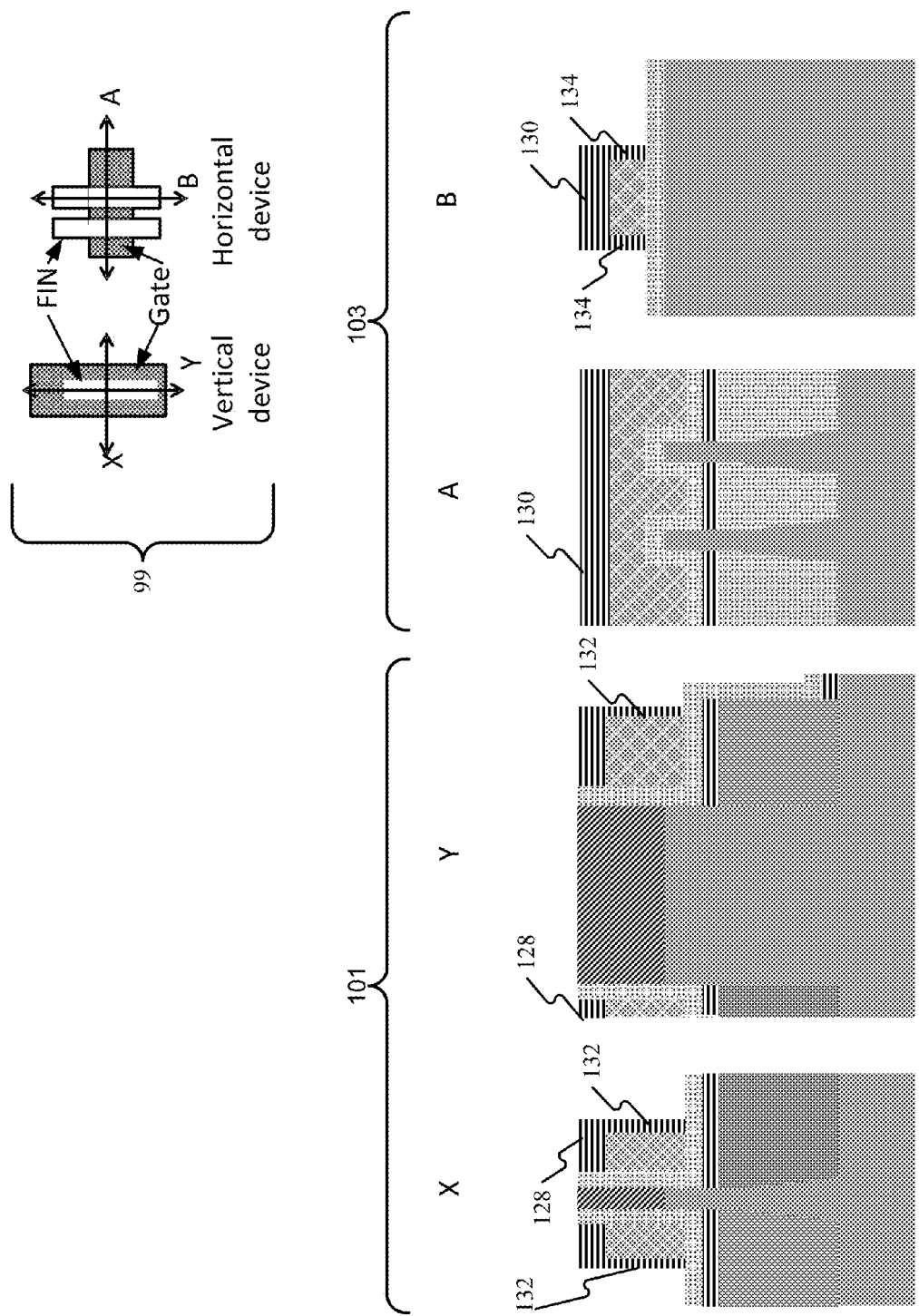

FIG. 17 illustrates the semiconductor structure 100 after formation of silicon nitride spacers 132 and 134 on the vertical and horizontal devices according to one or more embodiments. Silicon nitride spacers 132 and 134 are deposited conformally followed by an anisotropic etch to form vertical sidewall portions for the spacers.

Figure 18:
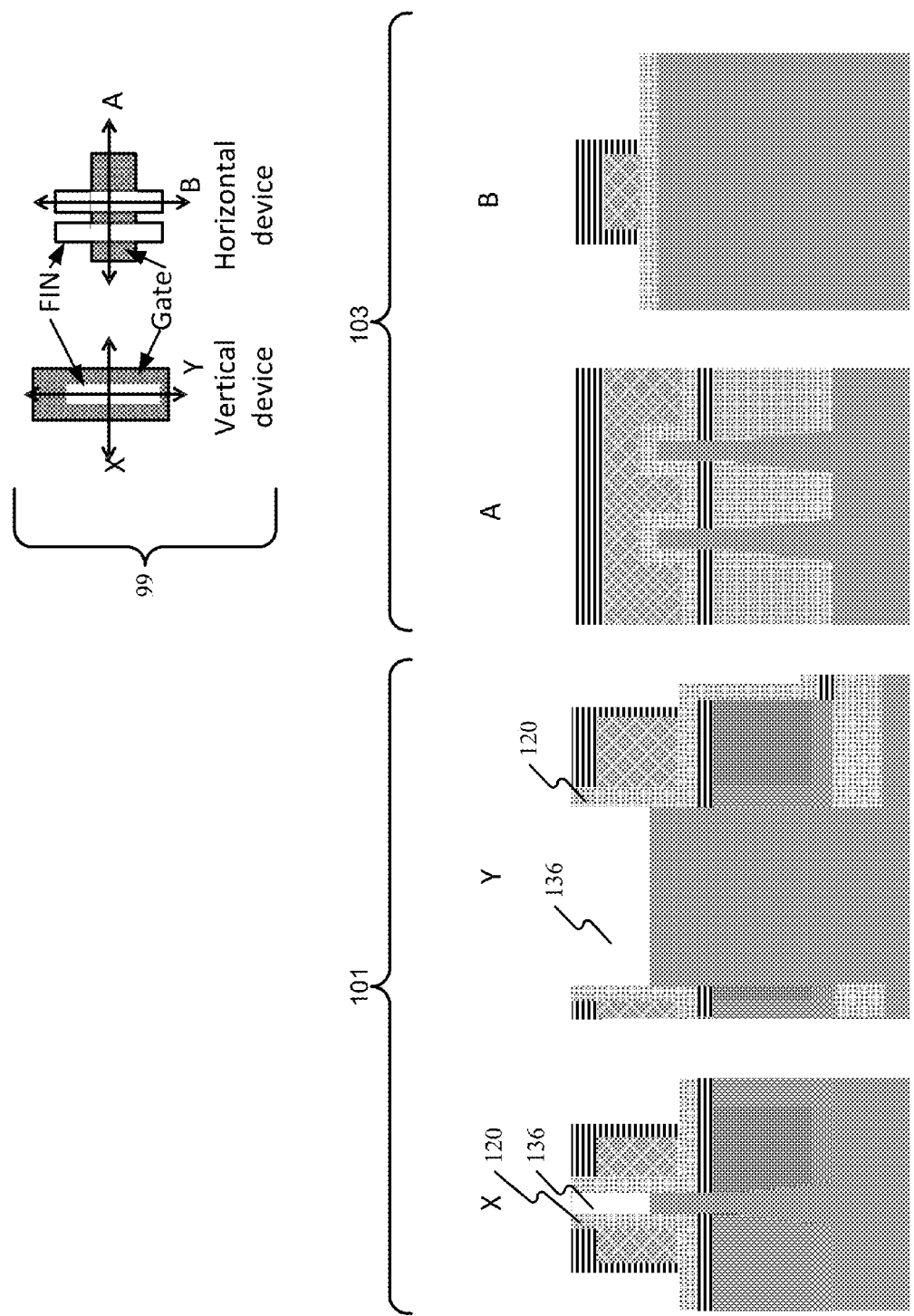

FIG. 18 illustrates the semiconductor structure 100 after removing the SiGe sacrificial layer 104 on vertical FET device 101, selective to surrounding materials, according to one or more embodiments.

Figure 19:
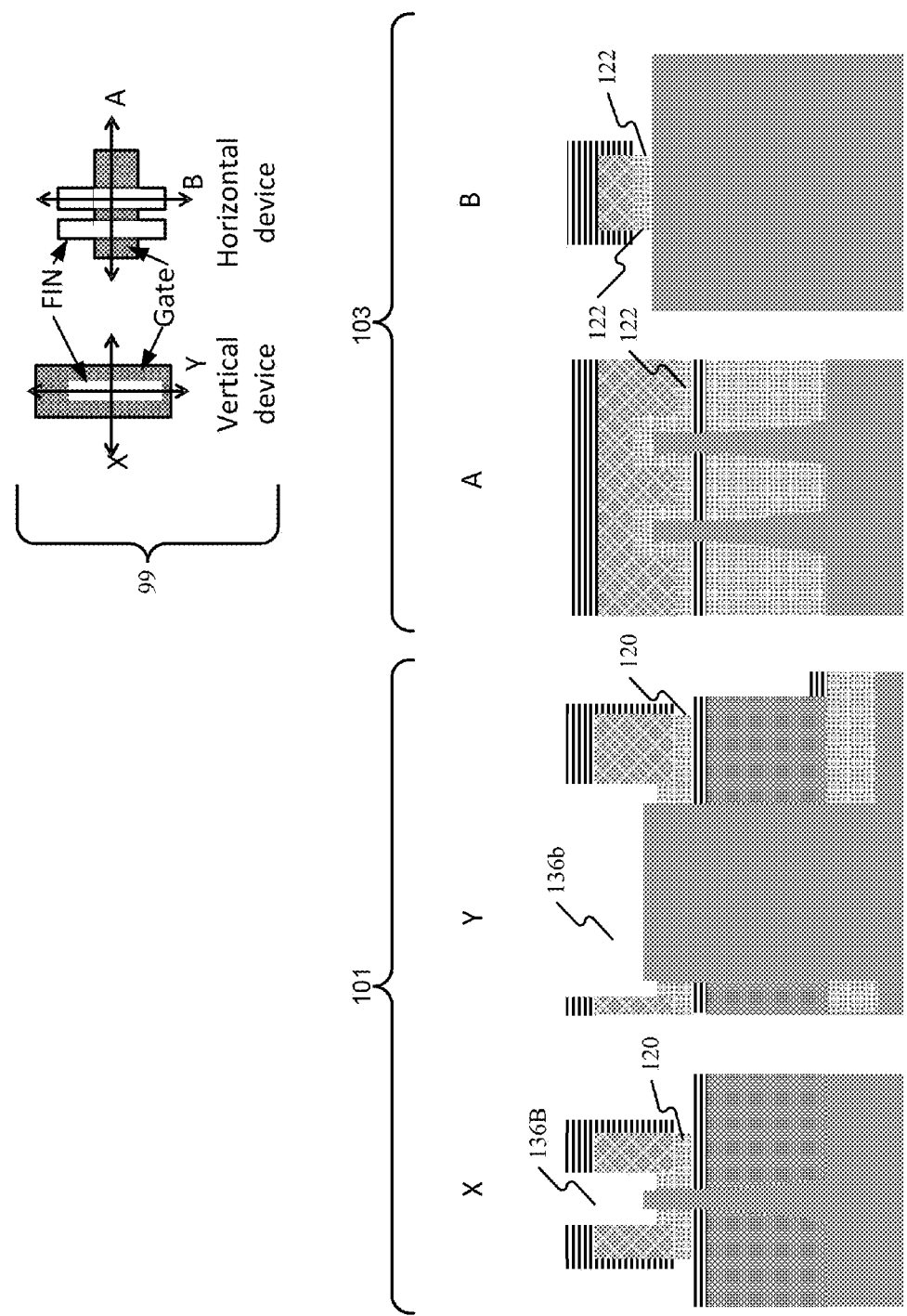

FIG. 19 illustrates the semiconductor structure 100 after removal of the silicon oxide sacrificial gate insulator layer 120 from exposed surfaces of vertical FET device 101 and horizontal FINFET device 103, according to one or more embodiments. In some aspects, the exposed sacrificial gate layer 120 is etched away, leaving only a base portion of sacrificial gate layer 120. A chemical etch process, such as dilute HF processes, can be used to etch away exposed surfaces of sacrificial gate layer 120.

Figure 20:
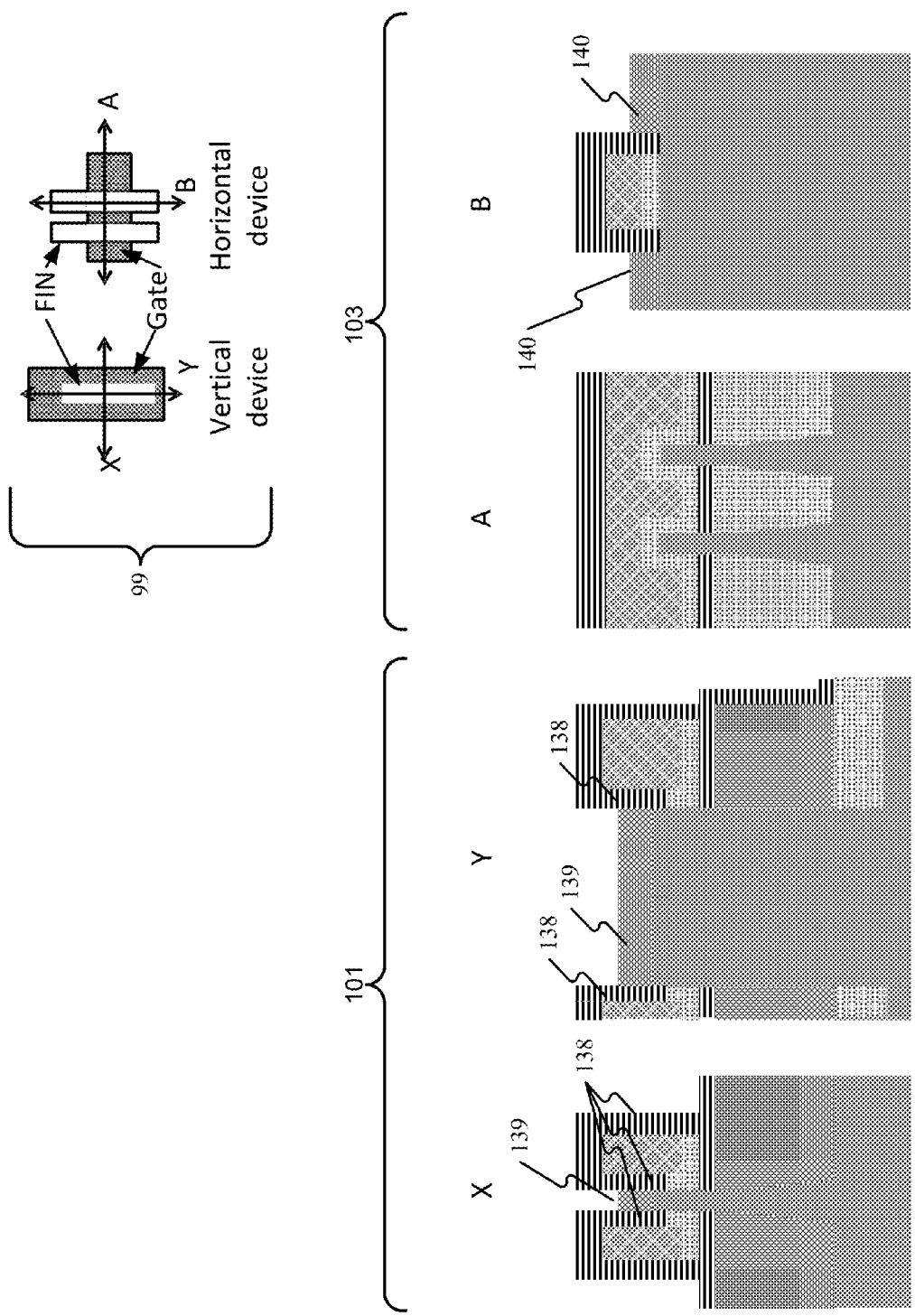

FIG. 20 illustrates semiconductor structure 100 after formation of thin spacers 138 on the vertical and horizontal devices and formation of a vertical device S/D 139 for the vertical FET device 101 and a source and drain 140 for horizontal FINFET device 103, according to one or more embodiments. In some aspects, vertical device doped S/D 139 is epitaxially grown on exposed surfaces of semiconductor substrate 102. The top S/D region 139 is heavily doped. For NFET, it may be doped by phosphorous, and for PFET, it can be doped by boron. The dopant concentration in the source/drain can range from $1\times10^{19}$ cm-3 to $2\times10^{21}$ cm$^{-3}$, or preferably between $2\times10^{20}$ cm$^{-3}$ to $1\times10^{21}$ cm$^{-3}$.

Figure 21:
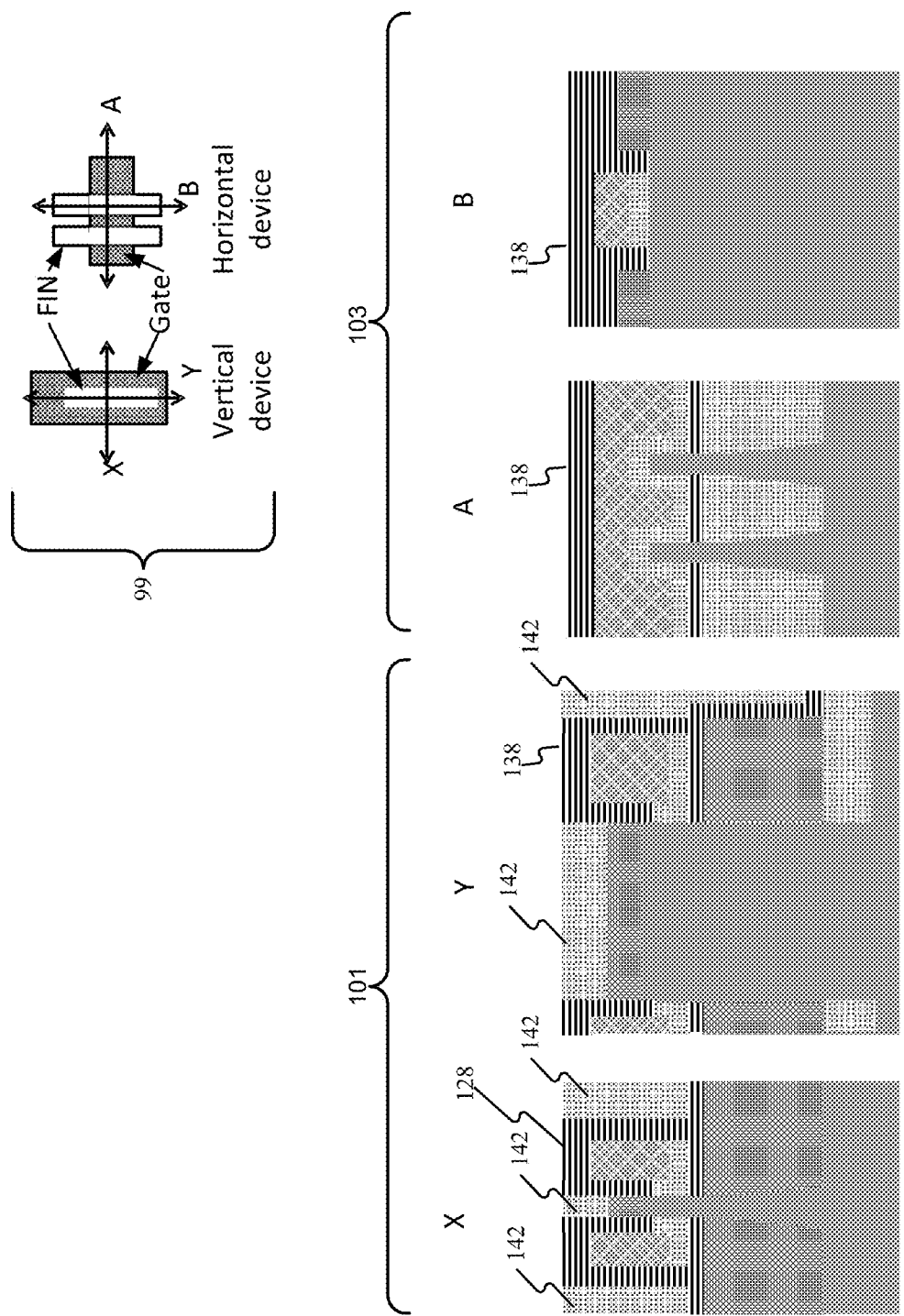

FIG. 21 illustrates semiconductor structure 100 after oxide inter-level dielectric (ILD) 142 deposition on the vertical and horizontal devices, and chemical mechanical planarization according to one or more embodiments. In some aspects, a chemical mechanical planarization step is performed to bring the vertical FET device 101 and the horizontal FINFET device to the same level, co-planar with an upper-most surface of ILD layer 142. In some embodiments, the ILD layer 142 is deposited by a spin-on coating operation. The ILD layer 142 can be any suitable material, such as, for example, an oxide. In some embodiments, the ILD layer 142 is silicon dioxide ($SiO_2$).

Figure 22:
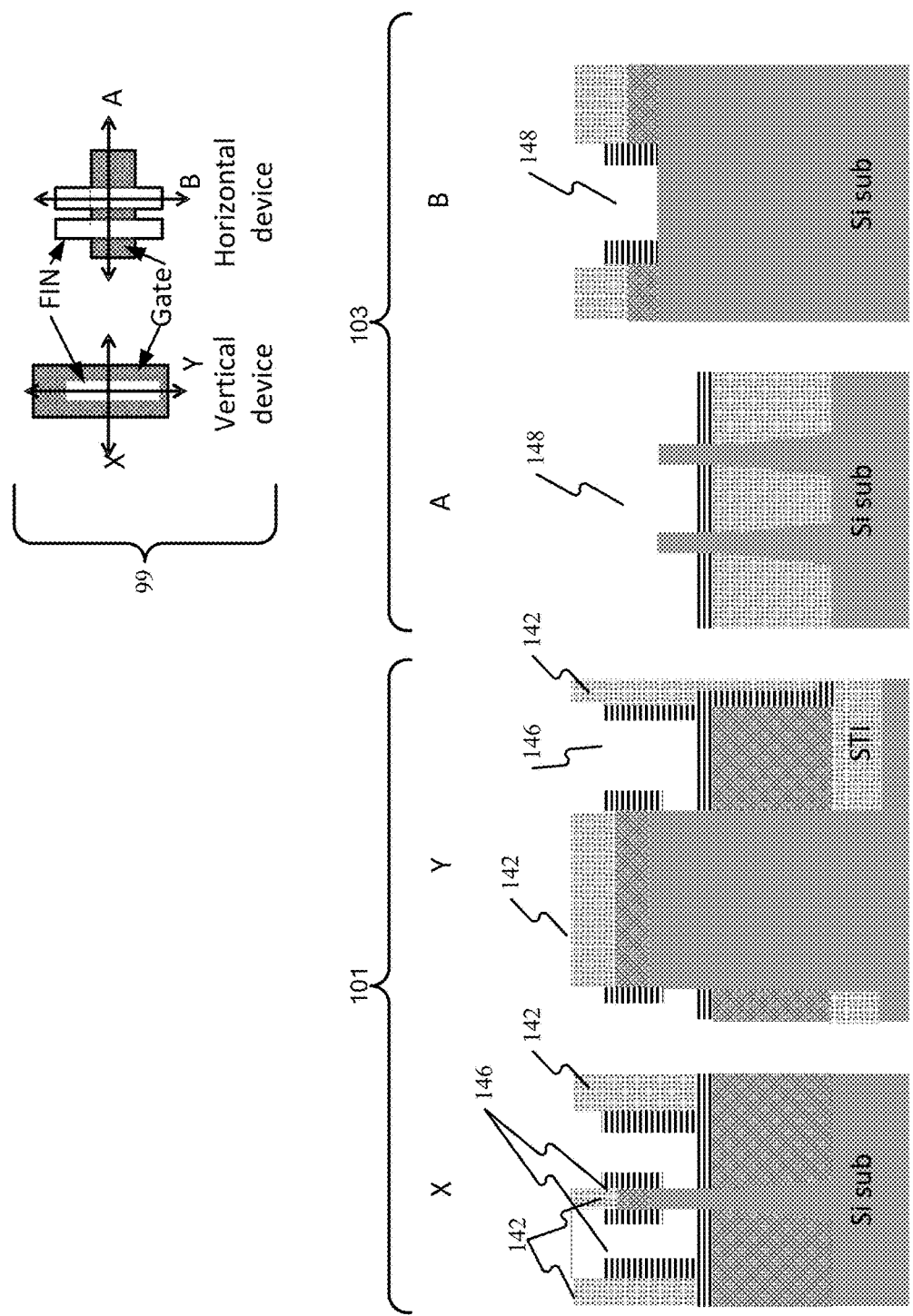

FIG. 22. Accordingly, a selective etching process is performed to remove top nitride layer 128 and 138, and also to remove sacrificial gate stack 124 on the vertical FET device 101 and sacrificial gate stack 126 on the horizontal FINFET device 103, as well as sacrificial gate insulator material 120 and 122.

Figure 23:
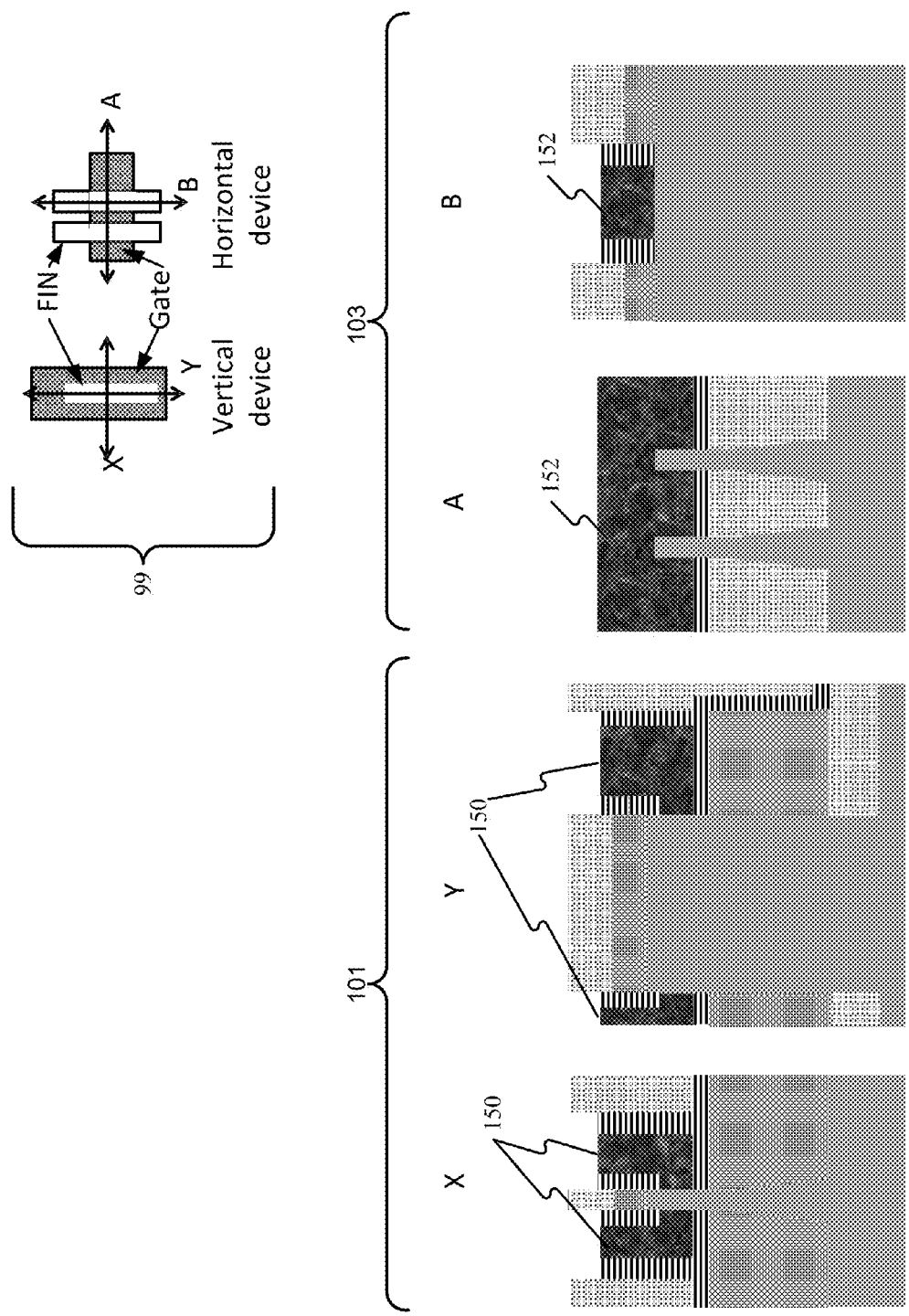

FIG. 23 illustrates semiconductor structure 100 after formation of high-k metal gate stacks 150 and 152, CMP, and recess, according to one or more embodiments. A high-k metal gate stack 150 is deposited on vertical FET device 101 and a high-k metal gate stack 152 is deposited on horizontal FINFET device 103. According to a non-limiting embodiment, gate dielectrics may be used for high-k metal gates 150 and 152, for example, silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to some embodiments, the recess could be non-uniform due to etch loading effect for different gate openings with different size or density. However, even when the recess is non-uniform, a uniform gate height is achieved, because the portion of high-k metal gate close to the vertical FET device 101 channel region is not affected by the gate recess, and is pre-defined by initial FIN height.

The high-k may further include dopants such as lanthanum, aluminum. In one non-limiting embodiment, the high-k metal gate stacks 150 and 152 can include a thin layer of hafnium oxide ($HfO_2$) having a thickness ranging from approximately 1 nm to approximately 5 nm. Another conformal deposition process may then be performed to deposit gate metals within gate channels 146 and 148 over the gate dielectrics. The gate metals include work-function metals such as titanium nitride, titanium carbide, titanium aluminum carbide, tantalum nitride and tantalum carbide; and conducting metals such as tungsten, aluminum, copper and poly-silicon.

Figure 24:
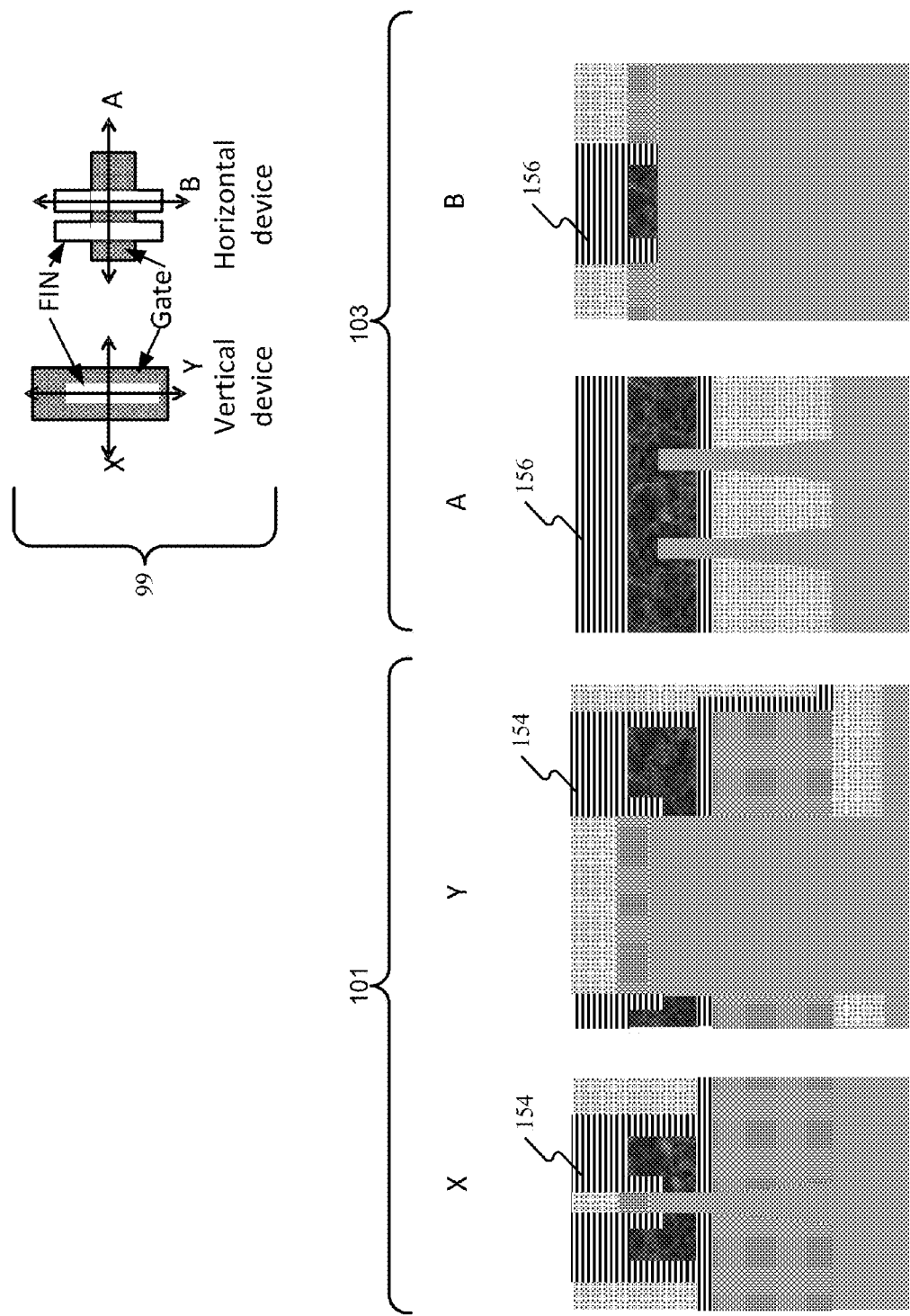

FIG. 24 illustrates the semiconductor structure 100 after formation of the high-k metal gate stacks 150 and 152, the high-k metal gate stacks will be recessed, and followed by a deposition of a top layer of silicon nitride to encapsulate gate stacks 150 and 152. A chemical mechanical planarization step can be performed to make the top surfaces of vertical FET device 101 and horizontal FINFET device 103 co-planar.

Figure 25:
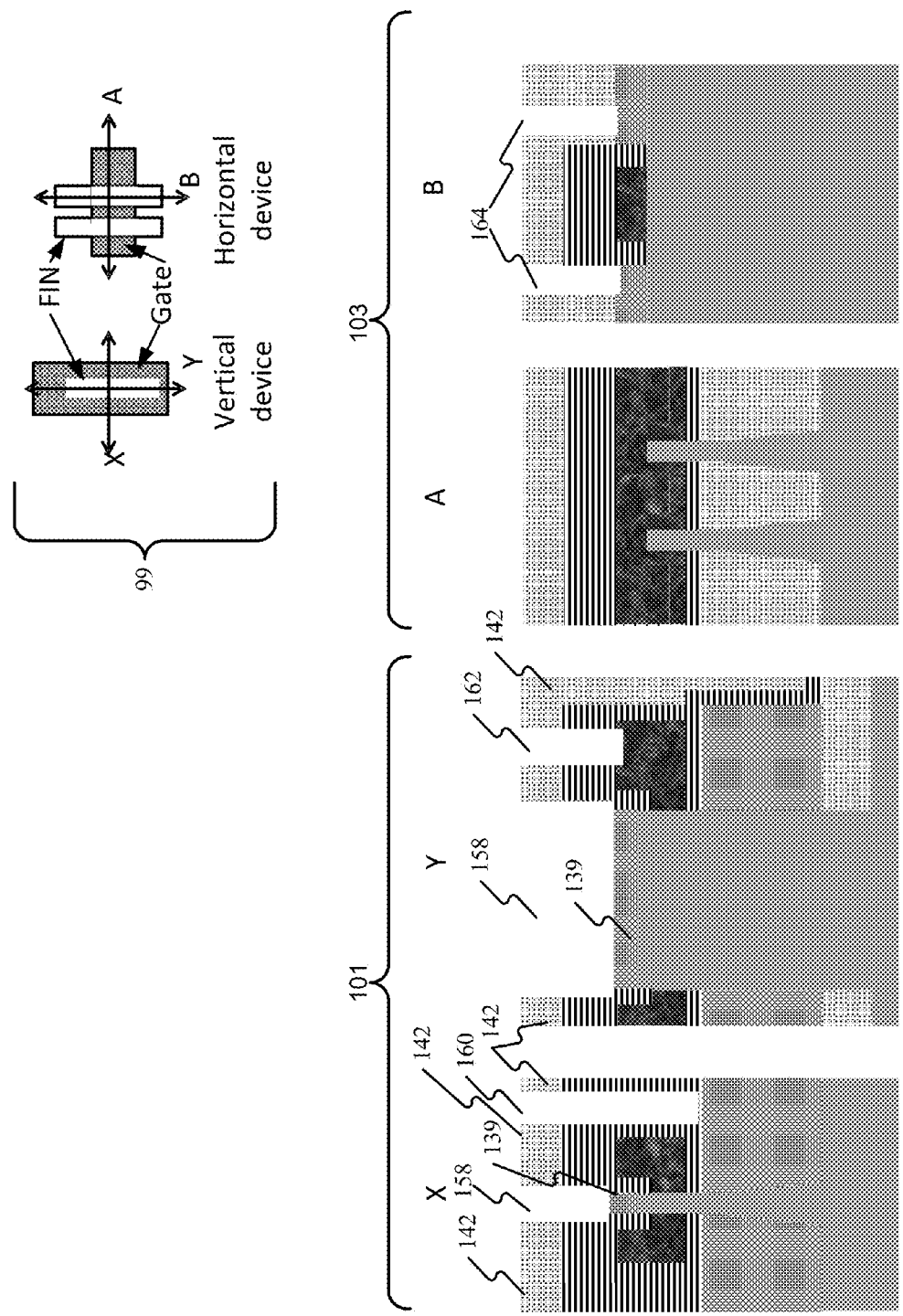

FIG. 25 illustrates the semiconductor structure 100 after formation of gate and drain contact openings 158, 160, 162, and 164, according to one or more embodiments. Referring now to FIG. 25, in some aspects, an oxide inter dielectric (ILD) layer 168 can be deposited after that. An OPL photoresist mask (not shown) is deposited to preserve the ILD layer 142 that is to remain after formation of the gate contact channels on the vertical and horizontal device. A controlled etching process is performed to form contact openings 158 for the vertical FET device 101 top S/D contact, and 160 for a vertical device bottom S/D contact and 162, for a vertical device gate contact, respectively. For horizontal FINFET device 103, a contact 164 for the horizontal device source and drain (S/D) contact is etched. Contact openings 158, 160, 162, and 164 can be etched simultaneously or in separate steps.

Figure 26:
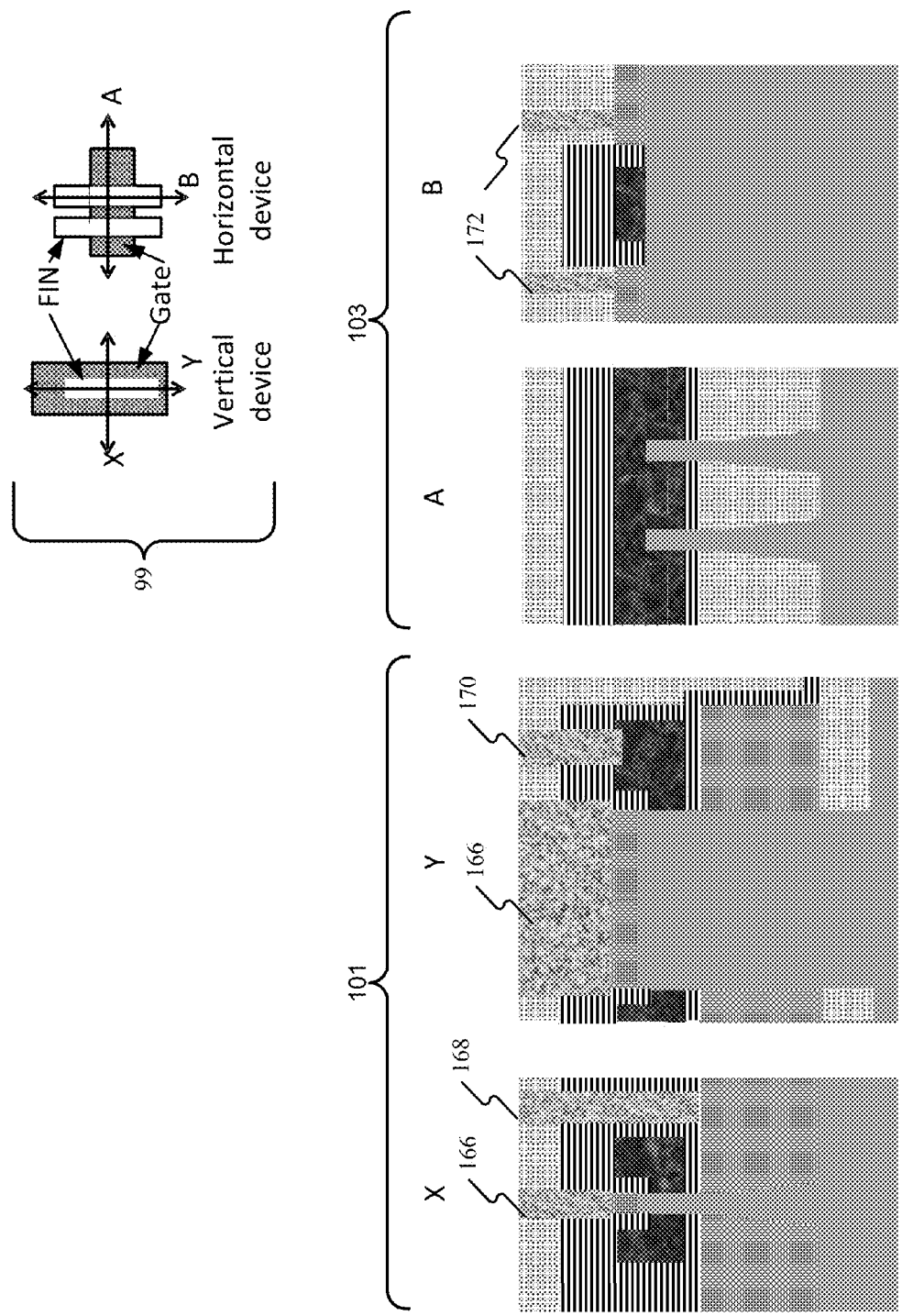

FIG. 26 illustrates semiconductor structure 100 after contact metallization.

As depicted in FIG. 26, semiconductor device structure includes a vertical FET device 101 and a horizontal FINFET device 103 integrated on the same chip. The VFET channel length is uniform and accurately set by the initial FIN height and is not dependent on the high-k metal gate recess process for gate structure 150. Vertical FET device 101 and horizontal FINFET device 103 (generally) have the same gate height, which can be beneficial because both devices have a similar middle-of-line process. Having both VFET and horizontal device on the same chip provides for fabrication of high-performance short channel devices on VFETs, while keeping low power, or high voltage devices on horizontal FINFETs.

According to some embodiments, semiconductor structure 100 forms an "L" shaped gate on vertical FET device 101. The "L" shaped gate can define the channel length for vertical FET device 101. The short side of the L-shape can be configured to determine channel length of vertical FET device 101, and is pre-determined by initial FIN height or sacrificial material. The long side of the L-shape is dependent on the HKMG recess process and does not affect the effective channel length.

Figure 27:
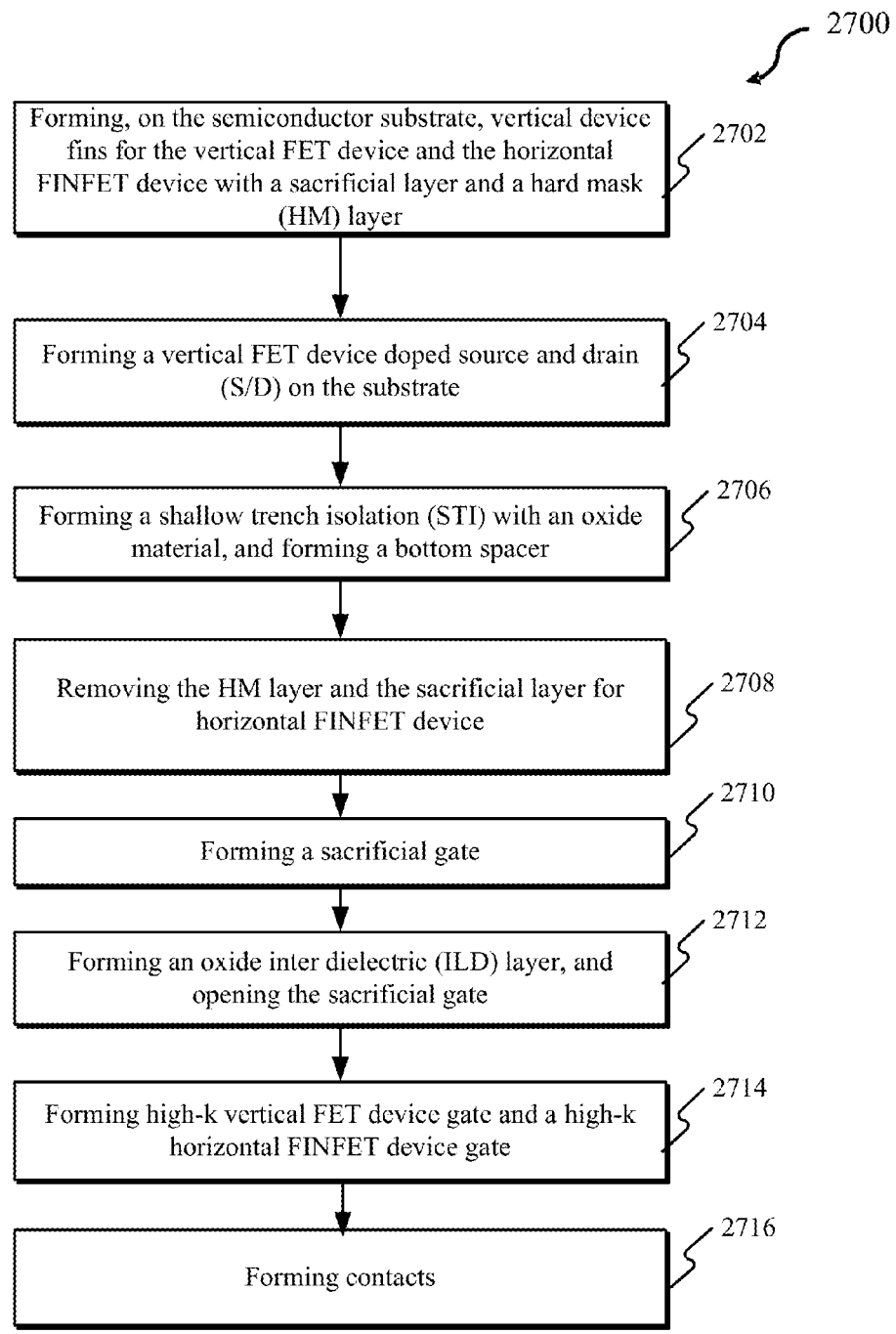

FIG. 27 is a flow chart for a method for forming a combined vertical and horizontal transistor on a common semiconductor substrate, according to one or more embodiments. As shown in block 2701, the process includes forming, on the semiconductor substrate, vertical device fins for the vertical FET device and the horizontal FINFET device with a sacrificial layer 104 and HM layer 110 and 112.

In some aspects, forming the vertical device fins for the vertical FET device and the horizontal FINFET device includes forming vertical device fins for vertical FET device 101 the semiconductor substrate 102. The vertical device fins include HM layer 110 and the sacrificial layer 104 proximal to semiconductor substrate 102. The forming the fins further includes forming HM layer 112 and the sacrificial layer proximal to the semiconductor substrate 102.

As shown in block 2704, a vertical device doped S/D 139 is formed for vertical FET device 101. According to some non-limiting embodiments, forming the vertical device doped S/D 139 can include forming an oxide layer of oxide material 106 at a base of the horizontal FINFET device fins, and the vertical device fins, where a top surface of the oxide layer 106 defines a final fin height for the horizontal FINFET device 103. Formation of vertical device doped S/D 139 can also include forming a spacer 115 for the vertical device fins and a bottom spacer 117 for the horizontal device fins, then forming an OPL photoresist mask 118 surrounding the vertical device fins. The method includes removing the oxide material 106 at the base of the vertical device fins, blocking the horizontal FINFET device 103 with a photoresist layer 119, and forming the doped dielectric layer 113 on semiconductor substrate 102 surrounding the vertical device fins As shown in block 2706, a STI is formed with an oxide material 106, and a bottom spacer 115 is formed, according to one non-limiting embodiment. In some aspects, forming the STI and a bottom spacer includes forming a bottom spacer proximate to the vertical FET device doped S/D and a bottom spacer proximate to the oxide layer at a base of the horizontal FINFET device fins, wherein the bottom spacer for the vertical FET device is epitaxially grown at the same time as the bottom spacer for the horizontal FINFET device.

In block 2708, the next step includes removing HM layer 110 and sacrificial layer 104 for horizontal FINFET device 103. Removing HM layer 110 and sacrificial layer 104 can include exposing a top surface of the horizontal device fins on semiconductor substrate 102 by removing the HM layer and the sacrificial layer proximate to semiconductor substrate 102. Forming the exposed top fin surfaces on the top surface of the horizontal device fins includes blocking vertical FET device 101 with a masking material, such as OPL photoresist mask 118. This step may also include forming an oxide layer on the exposed surfaces of the device transistor and the vertical FET device. The oxide layer may be, for example, sacrificial gate layer 120.

As depicted in block 2710, a sacrificial gate stack 124 and 126 is formed. Sacrificial gate stack 124 (on vertical FET device 101) and 126 (on horizontal FINFET device 103) is formed with an amorphous silicone (a-Si) fill layer proximal to the silicone oxide sacrificial gate layer 120 on the vertical FET device 101 and horizontal FINFET device 103. A planar surface is formed on an exposed upper surface of the epitaxial silicone nitride layer such that the vertical FET device is co-planar with the horizontal FINFET device, and sacrificial gate layer 120 is exposed.

Next, a top fin surface of vertical FET device 101 by removing a remaining portion of the sacrificial layer to expose the top fin surface of semiconductor substrate 102 at the vertical FET device 101. A gate channel 136 is formed, which exposes a top fin portion of the substrate. Gate channel 136 is then enlarged to form a gate stack trench by removing an exposed portion of the silicone oxide sacrificial gate layer 120 on the sidewalls of gate channel 136 (thus forming enlarged gate channel 136b as shown with respect to FIG. 19).

In some aspects, thin spacers 138 are then formed on the sidewalls of enlarged gate channel 136b. Thin spacers 138 protect a plurality of side walls on vertical FET device 101 and the horizontal FINFET device.

Next, the doped dielectric layer that includes horizontal device S/D 140 for the horizontal FINFET device 103 is formed. The vertical device doped S/D 139 for vertical FET device 101 is also formed simultaneously. On other aspects, the vertical and horizontal doped S/D material may be formed in separate steps.

Block 2712 depicts a formation step of an ILD layer 142 and 144 for the vertical and horizontal devices, and opening the sacrificial gate, according to one non-limiting embodiment. In some aspects, forming the ILD layer 142 and 144 is performed by epitaxially growing the ILD layer on the vertical FET device and the horizontal FINFET device proximal to a thin spacer layer, and forming a planar surface to a top surface of the thin spacers 138 of vertical FET device 101.

As shown in block 2714, method 2700 further includes forming high-k metal gate stacks 150 and 152 for vertical FET device 101 and horizontal FINFET device 103, respectively.

Finally, as depicted in block 2716, method 2700 includes formation of the channels 158, 160, 162, and 164, and formation of the SACs 154 and 156.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a vertical FET device and a horizontal FINFET device on a common semiconductor substrate, the method comprising:
   forming, on the semiconductor substrate, vertical device fins for the vertical FET device and the horizontal FINFET device with a sacrificial layer and a hard mask (HM) layer;
   forming a vertical FET device doped bottom source and drain (S/D) on the semiconductor substrate;
   forming a shallow trench isolation (STI) and a bottom spacer by forming the bottom spacer proximate to the vertical FET device doped S/D and a bottom spacer proximate to an oxide layer at a base of the horizontal FINFET device fins, wherein the bottom spacer for the vertical FET device is deposited at the same time as the bottom spacer for the horizontal FINFET device;
   removing the HM layer and the sacrificial layer for horizontal FINFET device;
   forming a sacrificial gate;
   forming an oxide inter dielectric (ILD) layer, and opening the sacrificial gate;
   forming high-k vertical FET device gate and a high-k horizontal FINFET device gate; and forming contacts for the vertical FET device and the horizontal FINFET device.

2. The method of claim 1, comprising forming a high-k vertical device gate length that is uniform with a high-k horizontal FINFET device gate length.

3. The method of claim 1, wherein the high-k vertical FET device gate and the high-k horizontal FINFET device gate are formed from the same material.

4. The method of claim 1, wherein forming the vertical device fins for the vertical FET device and the horizontal FINFET device comprises:
    forming vertical device fins for a vertical FET device on the semiconductor substrate, the vertical device fins comprising the HM layer and the sacrificial layer proximal to the substrate; and
    forming horizontal device fins for a horizontal FINFET device on the substrate, the horizontal device fins comprising the HM layer and the sacrificial layer proximal to the substrate.

5. The method of claim 1, wherein forming a vertical FET device bottom doped S/D comprises:
    forming an oxide layer at a base of the horizontal FINFET device fins and the vertical device fins, wherein a top surface of the oxide layer defines a final fin height for the horizontal FINFET device;
    forming a spacer on the vertical device fins and the horizontal device fins;
    forming a mask surrounding the horizontal device fins;
    removing the oxide layer at the base of the vertical device fins; and
    blocking the horizontal FINFET device with a photoresist layer and epitaxially forming a doped semiconductor layer on the substrate surrounding the vertical device fins.

6. The method of claim 1, wherein removing the HM layer and the sacrificial layer for the horizontal FINFET device comprises:
    exposing a top surface of the horizontal device fins on the substrate by removing the HM layer and the sacrificial layer proximate to the substrate, wherein forming the exposed top fin surfaces on the top surface of the horizontal device fins comprises blocking the vertical FET device with a masking material;
    forming an oxide layer on the exposed surfaces of the device transistor and the vertical FET device; and
    forming an amorphous silicon fill layer proximal to the oxide layer on the vertical FET device and the horizontal FINFET device.

7. The method of claim 6, wherein forming the amorphous silicon fill layer comprises:
    forming a planar surface on the amorphous silicone fill layer to expose the sacrificial layer of the vertical FET device;
    forming recessed portions on the vertical FET device and the horizontal FINFET device by recessing a portion of the amorphous silicone fill layer at the vertical FET device and the horizontal FINFET device; and
    forming an silicon nitride layer on a top remaining surface of the amorphous silicon layer.

8. The method of claim 7, wherein forming the top source/drain for VFET comprises:
    forming a planar surface on an exposed upper surface of the epitaxial silicon nitride layer such that the vertical FET device is co-planar with the horizontal FINFET device;
    exposing a top fin surface by removing a remaining portion of the sacrificial layer to expose the top fin surface of the substrate at the vertical FET device;
    forming a top source/drain trench by removing an exposed portion of the oxide layer on the vertical FET device and the horizontal FINFET device;
    forming a thin spacer layer that protects a plurality of side walls on the vertical FET device and the horizontal FINFET device; and
    forming a doped epi for the horizontal FINFET device and the vertical FET device.

9. A semiconductor comprising a vertical FET device and a horizontal FINFET device;
    wherein the vertical FET device and the horizontal FINFET device are on a common semiconductor substrate;
    wherein the vertical FET device has a bottom source/drain (S/D) thickness similar to a thickness of a shallow trench isolation (STI) of the horizontal FINFET device;
    wherein the horizontal FINFET device has a silicon nitride layer above the STI of the horizontal FINFET device; and
    wherein the vertical FET device comprises L-shaped gate.

10. The semiconductor of claim 9, wherein the vertical FET device have uniform gate length.

11. The semiconductor of claim 9, wherein the vertical FET device and the horizontal FINFET device comprise gates that are formed from the same material.

12. A semiconductor comprising a vertical FET device and a horizontal FINFET device on a common semiconductor substrate, the semiconductor comprising:
    vertical device fins for the vertical FET device;
    horizontal device fins for the horizontal FINFET device;
    a doped bottom source/drain (S/D) on the semiconductor substrate;
    a shallow trench isolation (STI) and a bottom spacer, wherein
        a bottom spacer is proximate to the vertical FET device doped S/D and a bottom spacer proximate to the oxide layer at a base of the horizontal FINFET device fins;
    an oxide inter dielectric (ILD) layer;
    contacts for the vertical FET device and the horizontal FINFET device;
    an L-shaped high-k vertical FET device gate; and
    a high-k horizontal FINFET device gate.

13. The semiconductor device of claim 12, wherein the high-k vertical FET device gate has a length uniform with a high-k horizontal FINFET device gate length.

14. The semiconductor device of claim 12, wherein the high-k vertical FET device gate and the high-k horizontal FINFET device gate are formed from the same material.

15. The semiconductor device of claim 12, wherein a height of the L-shaped high-k vertical FET device gate and height of the a gate nitride cap is similar for both vertical FET device and the horizontal FINFET device.

16. The semiconductor device of claim 12, wherein the high-k vertical FET device gate is lower than the high-k horizontal FINFET device gate.

17. The semiconductor device of claim 12, wherein a gate length of the high-k horizontal FINFET device gate is equal to or shorter than a FIN height of the horizontal FINFET device.

* * * * *